(12) United States Patent
Komatsu et al.

(10) Patent No.: US 10,403,679 B2
(45) Date of Patent: Sep. 3, 2019

(54) INTEGRATED CIRCUIT DEVICE, PHYSICAL QUANTITY MEASURING DEVICE, ELECTRONIC APPARATUS, AND VEHICLE

(71) Applicant: Seiko Epson Corporation, Tokyo (JP)

(72) Inventors: Fumikazu Komatsu, Okaya (JP); Akio Tsutsumi, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/043,681

(22) Filed: Jul. 24, 2018

(65) Prior Publication Data
US 2019/0035847 A1 Jan. 31, 2019

(30) Foreign Application Priority Data

Jul. 25, 2017 (JP) .................. 2017-143162

(51) Int. Cl.
| | |
|---|---|
| *H01L 27/20* | (2006.01) |
| *H03K 5/05* | (2006.01) |
| *H03L 7/07* | (2006.01) |
| *H03L 7/099* | (2006.01) |
| *H03H 9/13* | (2006.01) |
| *G01D 5/14* | (2006.01) |
| *H01L 41/047* | (2006.01) |
| *H01L 41/053* | (2006.01) |
| *H03K 5/24* | (2006.01) |

(Continued)

(52) U.S. Cl.
CPC .............. *H01L 27/20* (2013.01); *G01D 5/14* (2013.01); *H03H 9/13* (2013.01); *H03K 5/05* (2013.01); *H03L 7/07* (2013.01); *H03L 7/099* (2013.01); *H01L 41/0475* (2013.01); *H01L 41/053* (2013.01); *H03H 9/0519* (2013.01); *H03H 9/17* (2013.01); *H03H 9/205* (2013.01); *H03K 5/24* (2013.01)

(58) Field of Classification Search
CPC ... H01L 27/20; H01L 41/0475; H01L 41/053; G01D 5/14; H03K 5/05; H03K 5/24; H03H 9/13; H03H 9/0519; H03H 9/17; H03H 9/205; H03L 7/07; H03L 7/099
See application file for complete search history.

(56) References Cited

U.S. PATENT DOCUMENTS

2006/0017480 A1* 1/2006 Lin .................. H03H 11/265
327/158
2012/0250811 A1* 10/2012 Misek ................. H04L 7/0337
375/371

FOREIGN PATENT DOCUMENTS

JP  05-087954 A  4/1993

* cited by examiner

*Primary Examiner* — Daniel C Puentes
(74) *Attorney, Agent, or Firm* — Harness, Dickey & Pierce, P.L.C.

(57) ABSTRACT

An integrated circuit device includes a terminal region in which a second signal terminal to which a second signal is input is disposed, an AFE circuit (analog front-end circuit) that performs waveform shaping of the second signal, and a time-to-digital converter that converts a time difference between a transition timing of a first signal and a transition timing of the second signal subjected to waveform shaping, to a digital value. When a direction from a first side of the integrated circuit device toward a second side facing the first side is set as a first direction, the AFE circuit is disposed on the first direction side of the terminal region, and the time-to-digital converter is disposed on at least one side of the first direction side of the AFE circuit and a side of a direction intersecting the first direction.

18 Claims, 19 Drawing Sheets

(51) Int. Cl.
*H03H 9/205* (2006.01)
*H03H 9/05* (2006.01)
*H03H 9/17* (2006.01)

INTEGRATED CIRCUIT DEVICE, PHYSICAL QUANTITY MEASURING DEVICE, ELECTRONIC APPARATUS, AND VEHICLE

BACKGROUND

1. Technical Field

The present invention relates to an integrated circuit device, a physical quantity measuring device, an electronic apparatus, and a vehicle.

2. Related Art

An example of a technology of time-digital conversion of converting a time to a digital value in the related art includes a technology disclosed in JP-A-5-87954. A micro-time measuring device is disclosed in JP-A-5-87954. The micro-time measuring device includes a first crystal resonator that outputs a first clock pulse, a second crystal resonator that outputs a second clock pulse, an edge coincidence detection circuit, a synchronization counter, a microcomputer, and a transmission time control unit. The edge coincidence detection circuit detects a synchronization point between the first and second clock pulses. The synchronization counter performs counting processing with synchronization between the first and second clock pulses. The microcomputer calculates the unknown period from a start pulse to a stop pulse based on the value of the synchronization counter. The transmission time control unit outputs the start pulse in accordance with an output of the edge coincidence detection circuit and values of the synchronization counter and the microcomputer.

In the micro-time measuring device in JP-A-5-87954, the first and second crystal resonators, the edge coincidence detection circuit, the synchronization counter, the microcomputer, and the transmission time control unit are configured by discrete separate circuit components, respectively. Therefore, a method in which an analog front-end circuit that performs waveform shaping of a stop signal and a time-to-digital converter that performs time-digital conversion based on a signal after waveform shaping are integrated in one integrated circuit device (IC chip) has not been proposed. A method in which parasitic resistance or parasitic capacitance in, for example, a signal line of the stop signal is reduced and thus improvement of performance of time-digital conversion is improved has also not been proposed.

SUMMARY

An advantage of some aspects of the invention is to solve at least a part of the problems described above, and the invention can be implemented as the following forms or embodiments.

An aspect of the invention relates to an integrated circuit device performing signal processing based on a first signal and a second signal. The integrated circuit device includes a terminal region in which a second signal terminal to which the second signal is input is disposed, an analog front-end circuit that performs waveform shaping of the second signal, and a time-to-digital converter that converts a time difference between a transition timing of the first signal and a transition timing of the second signal subjected to waveform shaping, to a digital value. When a direction from a first side of the integrated circuit device toward a second side facing the first side is set as a first direction, the analog front-end circuit is disposed on the first direction side of the terminal region, and the time-to-digital converter is disposed on at least one side of the first direction side of the analog front-end circuit and a side of a direction intersecting the first direction.

According to the aspect of the invention, the analog front-end circuit is disposed on the first direction side of the terminal region in which the second signal terminal to which the second signal is input is disposed. The time-to-digital converter is disposed on the first direction side of the analog front-end circuit or on a side of a direction intersecting the first direction. According to such a layout, it is possible to form a signal line between the second signal terminal and the analog front-end circuit or between the analog front-end circuit and the time-to-digital converter, in an appropriate wiring form. Thus, it is possible to provide an integrated circuit device and the like in which degradation of performance of time-digital conversion caused by parasitic resistance or parasitic capacitance of the signal line can be suppressed.

In the aspect of the invention, the integrated circuit device may further include a first clock signal generation circuit that includes a first oscillation circuit and outputs a first clock signal generated by the first oscillation circuit oscillating a first resonator, and a second clock signal generation circuit that includes a second oscillation circuit and outputs a second clock signal generated by the second oscillation circuit oscillating a second resonator. The time-to-digital converter may perform time-digital conversion between the first clock signal and the second clock signal.

It is possible to improve performance of time-digital conversion by performing time-digital conversion with the first and second clock signals generated by the first and second resonators as described above.

In the aspect of the invention, the first clock signal generation circuit and the second clock signal generation circuit may be disposed on the first direction side of the time-to-digital converter.

According to this configuration, it is possible to form signal lines between the first and second clock signal generation circuits and the time-to-digital converter, in an appropriate wiring form.

In the aspect of the invention, the integrated circuit device may further include a first oscillation terminal connected to the first oscillation circuit, a second oscillation terminal connected to the first oscillation circuit, a third oscillation terminal connected to the second oscillation circuit, and a fourth oscillation terminal connected to the second oscillation circuit. In plan view in a direction perpendicular to a board of the integrated circuit device, the first oscillation terminal may be disposed at a position overlapping the first resonator and the second oscillation terminal may be disposed at a position which does not overlap the first resonator. In the plan view, the third oscillation terminal may be disposed at a position overlapping the second resonator and the fourth oscillation terminal may be disposed at a position which does not overlap the second resonator.

According to this configuration, it is possible to connect the first and third oscillation terminals to one electrodes of the first and second resonators and to connect the second and fourth oscillation terminals to the other electrodes of the first and second resonators, respectively.

In the aspect of the invention, the first oscillation terminal may have an area larger than that of the second oscillation terminal, and the third oscillation terminal may have an area larger than that of the fourth oscillation terminal.

According to this configuration, it is possible to, for example, improve connection strength at support portions in a case where places of the first and third oscillation terminals are used as the support portions of the first and second resonators.

In the aspect of the invention, the first clock signal generation circuit may be a first PLL circuit that includes the first oscillation circuit and a first control signal generation circuit that outputs a control signal for controlling an oscillation frequency of the first oscillation circuit to the first oscillation circuit. The second clock signal generation circuit may be a second PLL circuit that includes the second oscillation circuit and a second control signal generation circuit that outputs a control signal for controlling an oscillation frequency of the second oscillation circuit to the second oscillation circuit. In the plan view, the first control signal generation circuit and the second control signal generation circuit may be disposed between the first oscillation terminal and the third oscillation terminal.

According to this configuration, if the first and second PLL circuits are used as the first and second clock signal generation circuits, it is possible to realize phase synchronization between the first and second clock signals and to improve performance of time-digital conversion.

In the aspect of the invention, the integrated circuit device may further include a third oscillation circuit that generates a reference clock signal by oscillating a third resonator. The first clock signal generation circuit may generate the first clock signal having a phase synchronized with the reference clock signal, and the second clock signal generation circuit may generate the second clock signal having a phase synchronized with the reference clock signal.

It is possible to realize phase synchronization between the first and second clock signals by performing phase synchronization of the first and second clock signals with the reference clock signal as described above, and to improve performance of time-digital conversion.

In the aspect of the invention, the third oscillation circuit may be disposed on the first direction side of the first clock signal generation circuit and the second clock signal generation circuit.

According to this configuration, the first and second clock signal generation circuits may receive the reference clock signal from the third oscillation circuit positioned on the first direction side, generate the first and second clock signals, and supply the generated first and second clock signals to the time-to-digital converter positioned on an opposite direction side.

In the aspect of the invention, the integrated circuit device may further include a fifth oscillation terminal connected to the third oscillation circuit and a sixth oscillation terminal connected to the third oscillation circuit. In the plan view in the direction perpendicular to the board of the integrated circuit device, the fifth oscillation terminal may be disposed at a position overlapping the third resonator, and the sixth oscillation terminal may be disposed at a position which does not overlap the third resonator.

According to this configuration, the fifth oscillation terminal may be connected to the one electrode of the third resonator and the sixth oscillation terminal may be connected to the other electrode of the third resonator.

In the aspect of the invention, the first clock signal generation circuit may be disposed in a first region of the integrated circuit device, which is divided by a reference line along the first direction, and the second clock signal generation circuit may be disposed in a second region of the integrated circuit device, which is divided by the reference line.

According to this configuration, efficiency of the layout of the integrated circuit device is improved or efficiency of an arrangement in which the first and second resonators are mounted in the integrated circuit device is improved.

In the aspect of the invention, the analog front-end circuit may output first to n-th stop signals (n is an integer of 2 or greater) by comparing a voltage level of the second signal and a plurality of threshold voltages, and the time-to-digital converter may include first to n-th time-digital conversion units that perform time-digital conversion based on the first to n-th stop signals and first to n-th start signals which are based on the first signal.

According to this configuration, it is possible to realize appropriate time-digital conversion even in a case where a waveform of the stop signal as the second signal is blunt.

In the aspect of the invention, the first to n-th time-digital conversion units may be disposed on the first direction side of the analog front-end circuit.

According to this configuration, it is possible to dispose the first to n-th time-digital conversion units by using a region on the first direction side of the analog front-end circuit.

In the aspect of the invention, among the first to n-th time-digital conversion units, K time-digital conversion units (K is an integer of 1 or greater) may be disposed on the first direction side of the analog front-end circuit, and L time-digital conversion units (L is an integer of 1 or greater) which are different from the K time-digital conversion units may be disposed on a side of a direction intersecting the first direction of the analog front-end circuit.

According to this configuration, it is possible to dispose the first to n-th time-digital conversion units by using a region on the first direction side of the analog front-end circuit or on the side of the direction intersecting the first direction.

In the aspect of the invention, a first signal terminal for the first signal may be further disposed in the terminal region. The analog front-end circuit may further perform waveform shaping of the first signal from the first signal terminal. The time-to-digital converter may convert a time difference between the transition timing of the first signal subjected to waveform shaping and the transition timing of the second signal subjected to waveform shaping, to a digital value.

According to this configuration, it is possible to perform time-digital conversion by performing waveform shaping of the first signal in addition to the second signal and inputting the signals subjected to waveform shaping to the time-to-digital converter.

Another aspect of the invention relates to a physical quantity measuring device including the integrated circuit device described above.

Still another aspect of the invention relates to an electronic apparatus including the integrated circuit device described above.

Still another aspect of the invention relates to a vehicle including the integrated circuit device described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the preferred embodiment of the invention will be described in detail. The embodiment which will be described below does not unduly limit the contents of the invention described in the appended claims, and all of the configurations described in the embodiment are not indispensable as means for solving the problem in the invention.

1. Layout Example of Integrated Circuit Device

Figure 1:
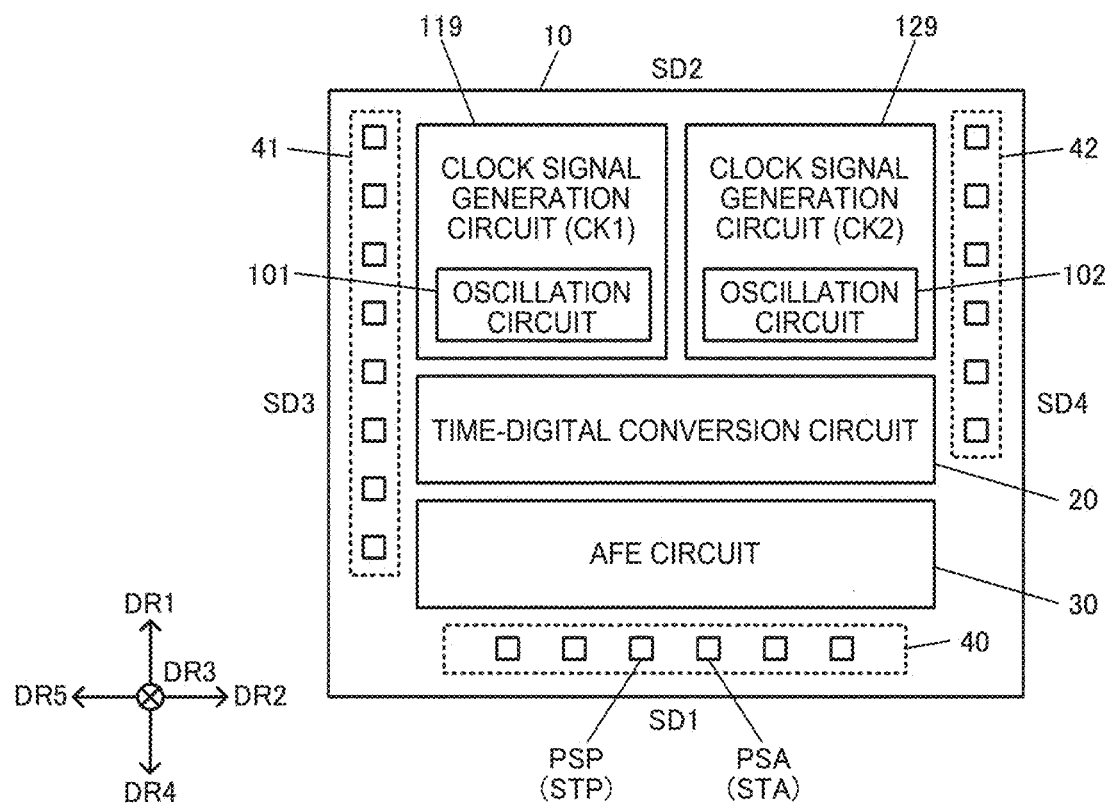
FIG. 1 illustrates a layout example of an integrated circuit device according to an embodiment.

FIG. 1 illustrates a layout example of an integrated circuit device 10 according to an embodiment. The integrated circuit device (IC) 10 in the embodiment performs signal processing (for example, time-digital conversion) based on a signal STA (first signal, start signal) and a signal STP (second signal, stop signal). The integrated circuit device 10 includes a terminal region 40, an AFE (analog front end) circuit 30, and a time-to-digital converter 20. The integrated circuit device may include clock signal generation circuits 119 and 129 and terminal regions 41 and 42. The integrated circuit device 10 is not limited to the configuration in FIG. 1. Various modifications as follows may be made. For example, some components (for example, clock signal generation circuit) of the integrated circuit device may be omitted, or other components (for example, processing circuit) may be added.

In FIG. 1, a direction from a side (first side) SD1 of the integrated circuit device (semiconductor chip) 10 toward a side (second side) SD2 is set as a direction (first direction) DR1 and a direction intersecting the direction DR1 is set as a direction (second direction) DR2. A direction intersecting (perpendicular to) the directions DR1 and DR2 is set as a direction (third direction) DR3. An opposite direction of the direction DR1 is set as a direction (fourth direction) DR4 and an opposite direction of the direction DR2 is set as a direction (fifth direction) DR5. The direction DR1 is a direction along sides SD3 and SD4 (third and fourth sides) of the integrated circuit device 10. The direction DR2 is a direction along the sides SD1 and SD2 of the integrated circuit device 10. The direction DR3 is a direction intersecting (perpendicular to) aboard (semiconductor board) of the integrated circuit device 10. The direction DR2 may be a leftward direction and the direction DR5 may be a rightward direction.

At least a signal terminal PSP for a signal STP (for second signal) (second signal terminal to which the second signal is input) is disposed in a terminal region (I/O region) 40. Specifically, the signal terminal PSP and a signal terminal (first signal terminal) PSA for a signal STA (for first signal) are disposed in the terminal region 40. Further, for example, terminals (VDD, VSS) for power supply may be disposed in the terminal region 40. The signal terminals PSA and PSP are, for example, pads of an IC which corresponds to the integrated circuit device 10. The terminal region 40 is a region in which a plurality of terminals is disposed and is a region along the side SD1 of the integrated circuit device 10. The terminal region 40 is a region in which the direction DR2 is set as a longitudinal direction. The integrated circuit device 10 has a terminal region 41 along the side SD3 or a terminal region 42 along the side SD4. A plurality of terminals is also disposed in the terminal regions 41 and 42. The terminal regions 41 and 42 are region in which the direction DR1 is set as a longitudinal direction.

The AFE circuit (analog front-end circuit) 30 is a circuit that performs waveform shaping (buffering) of a signal. For example, waveform shaping is performed on a signal having a blunt waveform, so as to obtain a square wave. For example, the AFE circuit (waveform shaping circuit, buffering circuit) 30 performs waveform shaping of the signal STP from the signal terminal PSP. For example, waveform shaping of the signal STP is performed by a comparator or a buffer circuit. The comparator compares the signal STP having a blunt waveform to a given threshold voltage. The AFE circuit 30 may also perform waveform shaping of the signal STA from the signal terminal PSA. For example, waveform shaping of the signal STA is performed by a comparator or a buffer circuit. The comparator compares the signal STA having a blunt waveform to a given threshold voltage.

At least the signal terminal PSP may be disposed in the terminal region 40 and the signal terminal PSA may not be disposed. In this case, the AFE circuit 30 performs waveform shaping of only the signal STP from the signal terminal PSP. In a case where the time-to-digital converter 20 is a spontaneous type that spontaneously generates the signal STA, the signal terminal PSA may be an output terminal of the signal STA.

The time-to-digital converter 20 converts a time difference between a transition timing of the signal STA and a transition timing of the signal STP, to a digital value. For example, the time-to-digital converter 20 converts the time difference in transition timing between the signal STA and the signal STP subjected to waveform shaping, to a digital value. In a case where the AFE circuit 30 performs waveform shaping of the signal STA, the time-to-digital converter 20 converts a time difference in transition timing between the signal STA (square wave signal) subjected to waveform shaping and the signal STP (square wave signal) subjected to waveform shaping, to a digital value. In the embodiment, time-digital conversion of converting a time difference in transition timing between the signals STA and STP to a digital value will be mainly described. However, it is not limited thereto. For example, time-digital conversion for measuring an absolute time point and the like may be provided.

In the integrated circuit device 10 in the embodiment, in a case where the direction from the side SD1 of the integrated circuit device 10 toward the side SD2 facing the side SD1 is set as DR1, as illustrated in FIG. 1, the AFE circuit 30 is disposed on the direction DR1 side (first direction side) of the terminal region 40. The time-to-digital converter 20 is disposed at least one side of the direction DR1 side of the AFE circuit 30 and a side of the direction intersecting the direction DR1. Here, the side of the direction intersecting the direction DR1 means at least one side of the direction DR2 side and a side of the direction DR5 which is an opposite direction of the direction DR2. In FIG. 1, the time-to-digital converter 20 is disposed on the direction DR1 side of the AFE circuit 30. For example, the AFE circuit 30 is disposed between the time-to-digital converter 20 and the terminal region 40 in which the signal terminal PSP and the like are disposed. For example, the terminal region 40 and the AFE circuit 30 are disposed to be adjacent to each other in the direction DR1. The AFE circuit 30 and the time-to-digital converter 20 are disposed to be adjacent to each other in the direction DR1. Being disposed to be adjacent to each other means, for example, that the circuits are disposed without interposing a circuit block (circuit element) between the above circuits. The circuit block means, for example, a region in which a plurality of circuit elements (transistor and the like) is disposed and which has a given area.

According to the disposition configuration in FIG. 1, it is possible to reduce a distance between the terminal region 40 and the AFE circuit 30 and to form a signal line of the signal STP and the like from the signal terminal PSP, in the AFE circuit 30 in an appropriate wiring form. For example, it is possible to form the signal line with a short path. It is possible to reduce a distance between the AFE circuit 30 and the time-to-digital converter 20 and to form a signal line of the signal STP and the like which have been received from the AFE circuit 30 and subjected to waveform shaping, in the time-to-digital converter 20 in an appropriate wiring form. For example, it is possible to appropriately form the signal line in a wiring region between the AFE circuit 30 and the time-to-digital converter 20. Thus, it is possible to suppress degradation of performance of time-digital conversion caused by parasitic resistance or parasitic capacitance of the signal line and to improve performance (accuracy and resolution) of time-digital conversion.

For example, in the above-described technology of the related art disposed in JP-A-5-87954, a circuit that performs waveform shaping of a stop pulse or a start pulse is not provided. Thus, time-digital conversion is performed by using a signal having a blunt waveform, and thus improvement of performance of time-digital conversion has difficulty. On the contrary, in the embodiment, the AFE circuit 30 that performs waveform shaping is provided in the integrated circuit device 10. Thus, waveform shaping of the signal STP and the like from the signal terminal PSP may be performed and the signal STP subjected to waveform shaping may be input to the time-to-digital converter 20. Thus, the time-to-digital converter 20 may perform time-digital conversion by using a signal having a waveform which is approximate to a square wave and it is possible to improve performance of time-digital conversion. In the technology of the related art disposed in JP-A-5-87954, each circuit block is realized by a discrete circuit component. Thus, circuit blocks are connected to each other by wirings of a circuit board. Therefore, parasitic resistance or parasitic capacitance of the signal line is increased, and performance of time-digital conversion is degraded. On the contrary, in the embodiment, the AFE circuit 30 and the time-to-digital converter 20 are integrated in the integrated circuit device 10. Thus, it is possible to lay out the circuit blocks such as the AFE circuit 30 or the time-to-digital converter 20, with a short distance in the integrated circuit device 10 which is a semiconductor chip. Accordingly, it is possible to reduce parasitic resistance or parasitic capacitance between the circuit blocks and to improve performance of time-digital conversion, in comparison to the method of the related art, in which discrete circuit components are mounted on a circuit board.

The clock signal generation circuit (first clock signal generation circuit) 119 includes an oscillation circuit (first oscillation circuit) 101. The clock signal generation circuit 119 outputs a clock signal (first clock signal) CK1 generated in a manner that the oscillation circuit 101 oscillates an resonator (first resonator) XTAL1 in FIGS. 7 and 8, which will be described later. The clock signal generation circuit (second clock signal generation circuit) 129 includes an oscillation circuit (second oscillation circuit) 102. The clock signal generation circuit 129 outputs a clock signal (second clock signal) CK2 generated in a manner that the oscillation circuit 102 oscillates an resonator (second resonator) XTAL2. The time-to-digital converter 20 performs time-digital conversion based on the clock signals CK1 and CK2. As described above, if time-digital conversion is performed by using the clock signals CK1 and CK2 generated by the resonators XTAL1 and XTAL2, performance of time-digital conversion is improved in comparison to a method using only a delay element of a semiconductor element. In particular, if crystal resonators are used as the resonators XTAL1 and XTAL2, there is an advantage, for example, that it is possible to suppress fluctuation in clock frequencies of the clock signals CK1 and CK2, which occurs by environmental fluctuation such as temperature fluctuation, to the minimum.

In the embodiment, the clock signal generation circuits 119 and 129 are disposed on the direction DR1 side of the time-to-digital converter 20. For example, the time-to-digital converter 20 is disposed between the AFE circuit 30 and the clock signal generation circuits 119 and 129. For example, the clock signal generation circuits 119 and 129 and the time-to-digital converter 20 are disposed to be adjacent to each other and are disposed without interposing a circuit block between the clock signal generation circuits and the time-to-digital converter. According to this configuration, it is possible to reduce a distance between the clock signal generation circuits 119 and 129 and the time-to-digital converter 20 and to form the signal lines of the clock signals CK1 and CK2 from the clock signal generation circuits 119 and 129, in the time-to-digital converter 20 in an appropriate wiring form. For example, it is possible to appropriately form signal lines in a wiring region between the clock signal generation circuits 119 and 129 and the time-to-digital converter 20. Thus, it is possible to suppress degradation of performance of time-digital conversion occurring by parasitic resistance or parasitic capacitance of the signal line and to improve performance of time-digital conversion.

Figure 2:
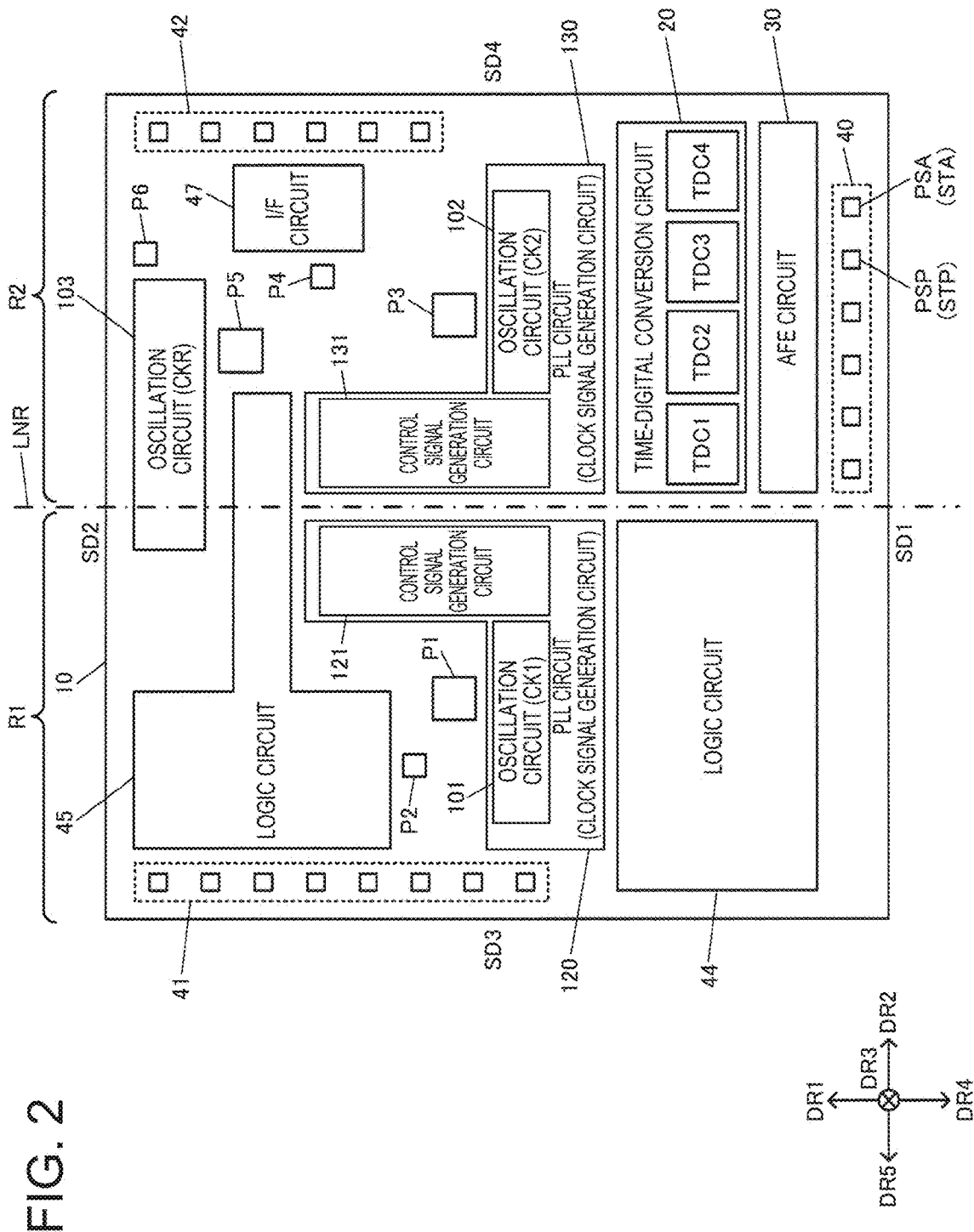
FIG. 2 illustrates a first detailed layout example of the integrated circuit device in the embodiment.

FIG. 2 illustrates a first detailed layout example of the integrated circuit device 10 in the embodiment. In FIG. 2, the time-to-digital converter 20 includes time-digital conversion units (first to n-th time-digital conversion units) TDC1 to TDC4. The time-digital conversion units TDC1 to TDC4 perform time-digital conversion based on first to fourth stop signals (first to n-th stop signals (n is an integer of 2 or greater)) from the AFE circuit 30. The time-digital conversion units TDC1 to TDC4 are disposed on the direction DR1 side of the AFE circuit 30. For example, the time-digital conversion units TDC1 to TDC4 are disposed to be adjacent to the AFE circuit 30 without interposing another circuit block between the time-digital conversion units and the AFE circuit. According to this configuration, it is possible to form signal lines between the AFE circuit 30 and the time-digital conversion units TDC1 to TDC4, in an appropriate wiring form and to improve performance of time-digital conversion. The time-digital conversion units TDC1 to TDC4 will be described in detail with reference to FIG. 6 which will be described later.

In FIG. 2, PLL circuits 120 and 130 are provided as the clock signal generation circuits 119 and 129 in FIG. 1. The PLL circuit (first PLL circuit) 120 includes the oscillation circuit 101 and a control signal generation circuit (first control signal generation circuit) 121 that outputs a control signal for controlling the oscillation frequency to the oscillation circuit 101. The PLL circuit (second PLL circuit) 130 includes the oscillation circuit 102 and a control signal generation circuit (second control signal generation circuit) 131 that outputs a control signal for controlling the oscillation frequency to the oscillation circuit 102. For example, the control signals output by the control signal generation circuits 121 and 131 correspond to control voltages. The oscillation circuits 101 and 102 are voltage-controlled type oscillation circuits (VCOs) in which the oscillation frequencies are controlled by the control voltages. The control signal may be a digital signal. In this case, the oscillation circuits 101 and 102 are circuits in which the oscillation frequency is controlled by a digital signal. The control signal may correspond to control currents. The oscillation circuits 101 and 102 may be circuits in which the oscillation frequency is controlled by the control current. As described above, if the PLL circuits 120 and 130 are used as the clock signal generation circuits 119 and 129, precision of clock signals CK1 and CK2 is improved. For example, it is possible to perform phase synchronization between the clock signals CK1 and CK2 and to hold a frequency relationship or a phase relationship between the clock signals CK1 and CK2 to be a predetermined relationship. Thus, performance of time-digital conversion is further improved. The PLL circuits 120 and 130 will be described in detail with reference to FIG. 13 which will be described later.

Figure 7:
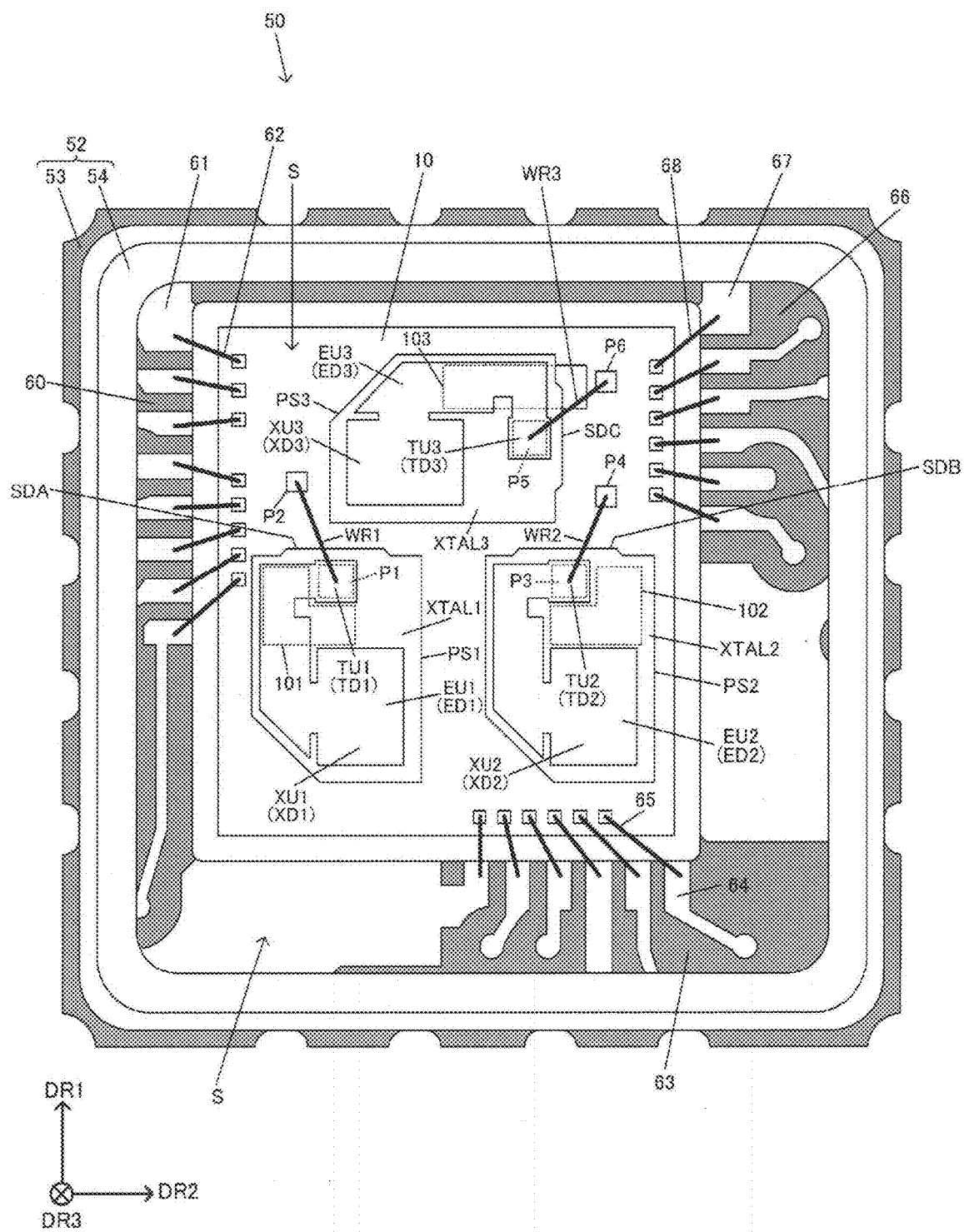
FIG. 7 is a plan view illustrating a configuration example of the physical quantity measuring device in the embodiment.
Figure 8:
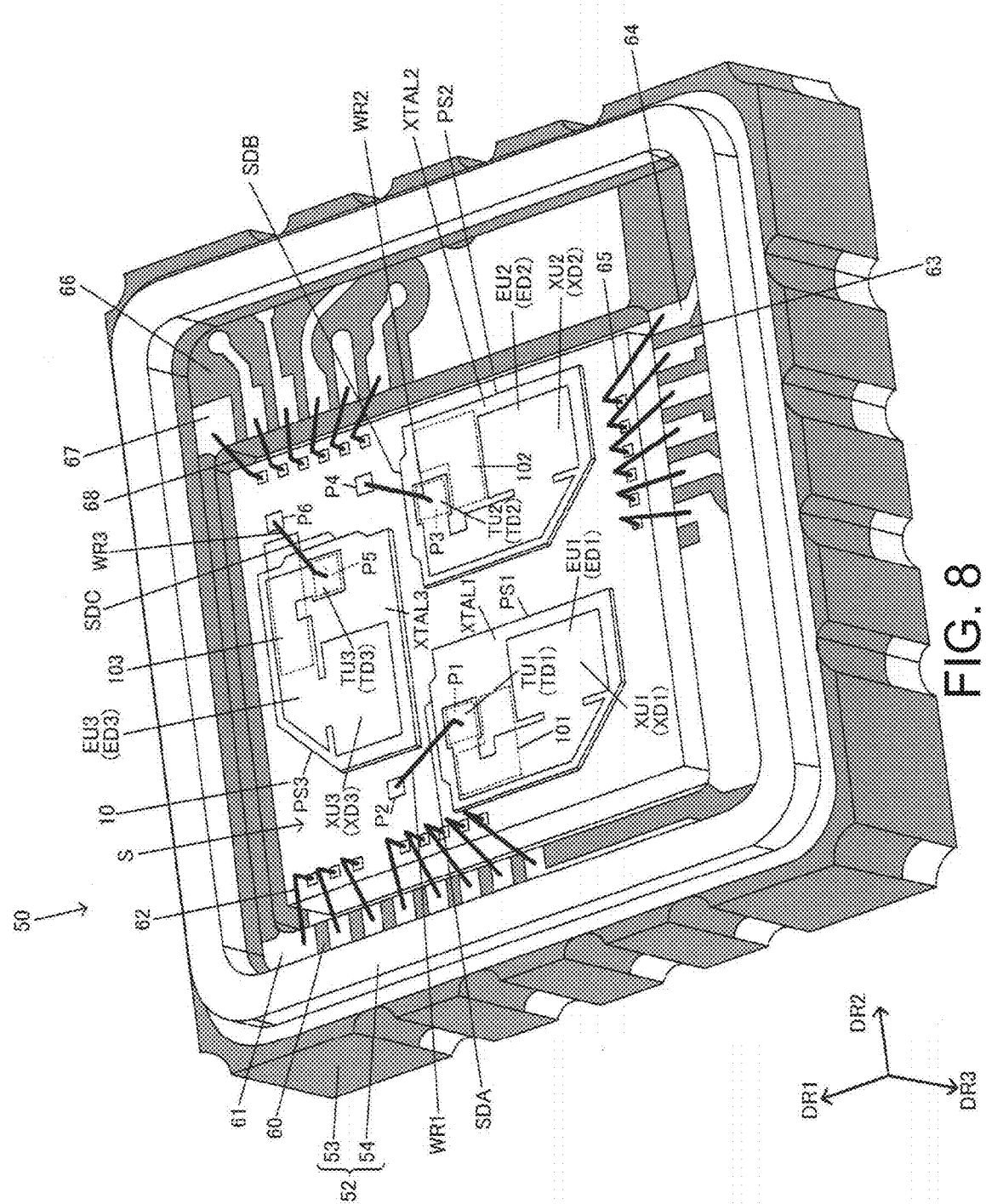
FIG. 8 is a perspective view illustrating the configuration example of the physical quantity measuring device in the embodiment.

The integrated circuit device 10 includes an oscillation circuit 103 (third oscillation circuit) that generates a reference clock signal CKR by oscillating an resonator (third resonator) XTAL3 in FIGS. 7 and 8. The PLL circuit 120 generates the clock signal CK1 having a phase synchronized with the reference clock signal CKR. The PLL circuit 130 generates the clock signal CK2 having a phase synchronized with the reference clock signal CKR. Since the phases of the clock signals CK1 and CK2 are synchronized with the reference clock signal CKR, the phase of the clock signals CK1 and CK2 are synchronized with each other and thus it is possible to hold a frequency relationship or a phase relationship between the clock signals CK1 and CK2 to be a predetermined relationship.

The oscillation circuit 103 is disposed on the direction DR1 side of the PLL circuits 120 and 130 (clock signal generation circuits 119 and 129). According to this configuration, the PLL circuits 120 and 130 may receive the reference clock signal CKR from the oscillation circuit 103 on the direction DR1 side, generate the clock signals CK1 and CK2, and supply the generated clock signals CK1 and CK2 to the time-to-digital converter 20 on the side of the direction DR4 which is an opposite direction of the direction DR1. As illustrated in FIGS. 7 and 8, in a case where the resonators XTAL1, XTAL2, and XTAL3 are mounted on the integrated circuit device 10, the resonator XTAL3 connected to the oscillation circuit 103 may be mounted above the oscillation circuit 103 disposed on the direction DR1 side of the PLL circuits 120 and 130.

Logic circuits 44 and 45 or an I/F circuit 47 is also provided in the integrated circuit device 10. The logic circuits 44 and 45 perform various kinds of processing and are realized, for example, by automatic placement and routing of a gate array and the like. The I/F circuit 47 is a circuit that performs interface processing by communication between the I/F circuit 47 and an external device. For example, the I/F circuit 47 performs high-speed serial interface processing by using a differential signal having a low amplitude, such as a positive emitter coupled logic (PECL) or low voltage differential signaling (LVDS). It is possible to monitor clock frequencies and the like of the clock signals CK1 and CK2 or the reference clock signal CKR by the I/F circuit 47. Terminals (first oscillation terminal and second oscillation terminal) P1 and P2 connected to the oscillation circuit 101 and terminals (third oscillation terminal and fourth oscillation terminal) P3 and P4 connected to the oscillation circuit 102 are provided in the integrated circuit device 10. In addition, terminals (fifth oscillation terminal and sixth oscillation terminal) P5 and P6 connected to the oscillation circuit 103 are provided. The terminals P1 to P6 will be described in detail with reference to FIGS. 7 and 8 which will be described later.

In FIG. 2, regions (first region and second region) R1 and R2 are regions of the integrated circuit device 10, which are obtained by division of a reference line LNR along the direction DR1. The reference line LNR is a virtual line passing through, for example, the center of the integrated circuit device 10. In this case, the PLL circuit 120 is disposed in the region R1 divided by the reference line LNR, and the PLL circuit 130 is disposed in the region R2 divided by the reference line LNR. For example, the PLL circuits 120 and 130 are disposed line-symmetrically by using the reference line LNR as an axis of symmetry. According to this configuration, as illustrated in FIGS. 7 and 8, in a case where the resonators XTAL1 and XTAL2 are mounted on the integrated circuit device 10, the resonator XTAL1 or the PLL circuit 120 may be disposed in the region R1, and the resonator XTAL2 or the PLL circuit 130 may be disposed in the region R2. Thus, efficiency of the layout of the integrated circuit device 10 is improved or efficiency of an arrangement in which the resonators XTAL1 and XTAL2 are mounted in the integrated circuit device 10 is improved. Accordingly, it is possible to realize size reduction of the integrated circuit device 10 or a physical quantity measuring device 50 in which the integrated circuit device 10 is mounted.

Figure 3:
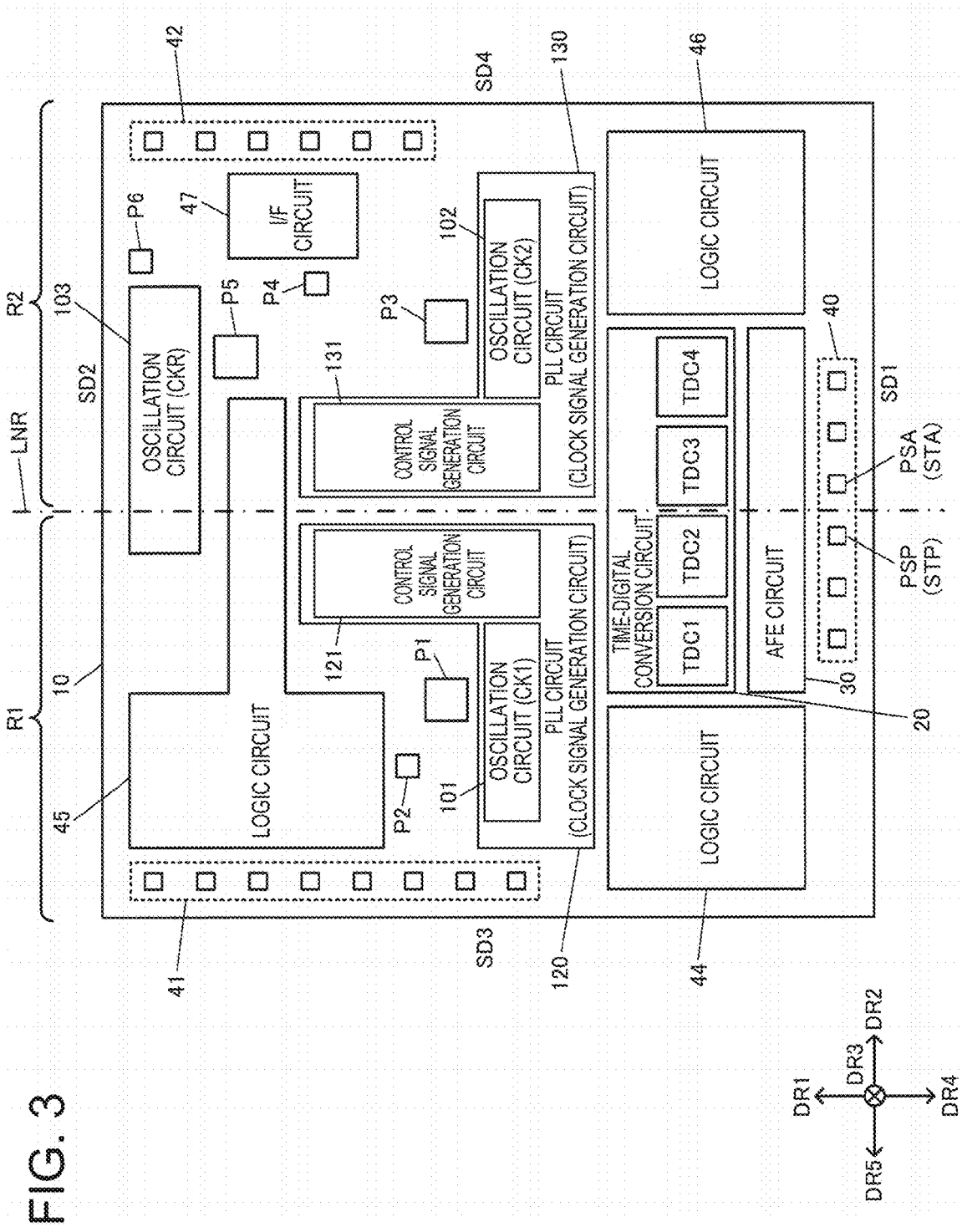
FIG. 3 illustrates a second detailed layout example of the integrated circuit device in the embodiment.

FIG. 3 illustrates a second detailed layout example of the integrated circuit device 10. In FIG. 3, in addition to the PLL circuits 120 and 130, the time-to-digital converter or the logic circuits 44 and 46 are disposed line-symmetrically by using the reference line LNR as the axis of symmetry. The time-digital conversion units TDC1 and TDC2 of the time-to-digital converter 20 or the signal terminal PSP for the signal STP is provided in the region R1. The time-digital conversion units TDC3 and TDC4 or the signal terminal PSA for the signal STA are provided in the region R2. Among circuits constituting the AFE circuit 30, a waveform shaping circuit (comparator, buffering circuit, and the like) to which the signal STP is input is disposed in the region R1, and a waveform shaping circuit to which the signal STA is input is disposed in the region R2. Thus, a symmetrical layout, for example, in which a circuit relating to the signal STP is disposed in the region R1 and a circuit relating to the signal STA is disposed in the region R2 is possible. Since such a symmetrical layout is made, for example, it is easy to cause parasitic resistance or parasitic capacitance of the signal line in the region R1 to be equal to parasitic resistance or parasitic capacitance of the signal line in the region R2 and thus it is possible to improve performance of time-digital conversion.

Figure 4:
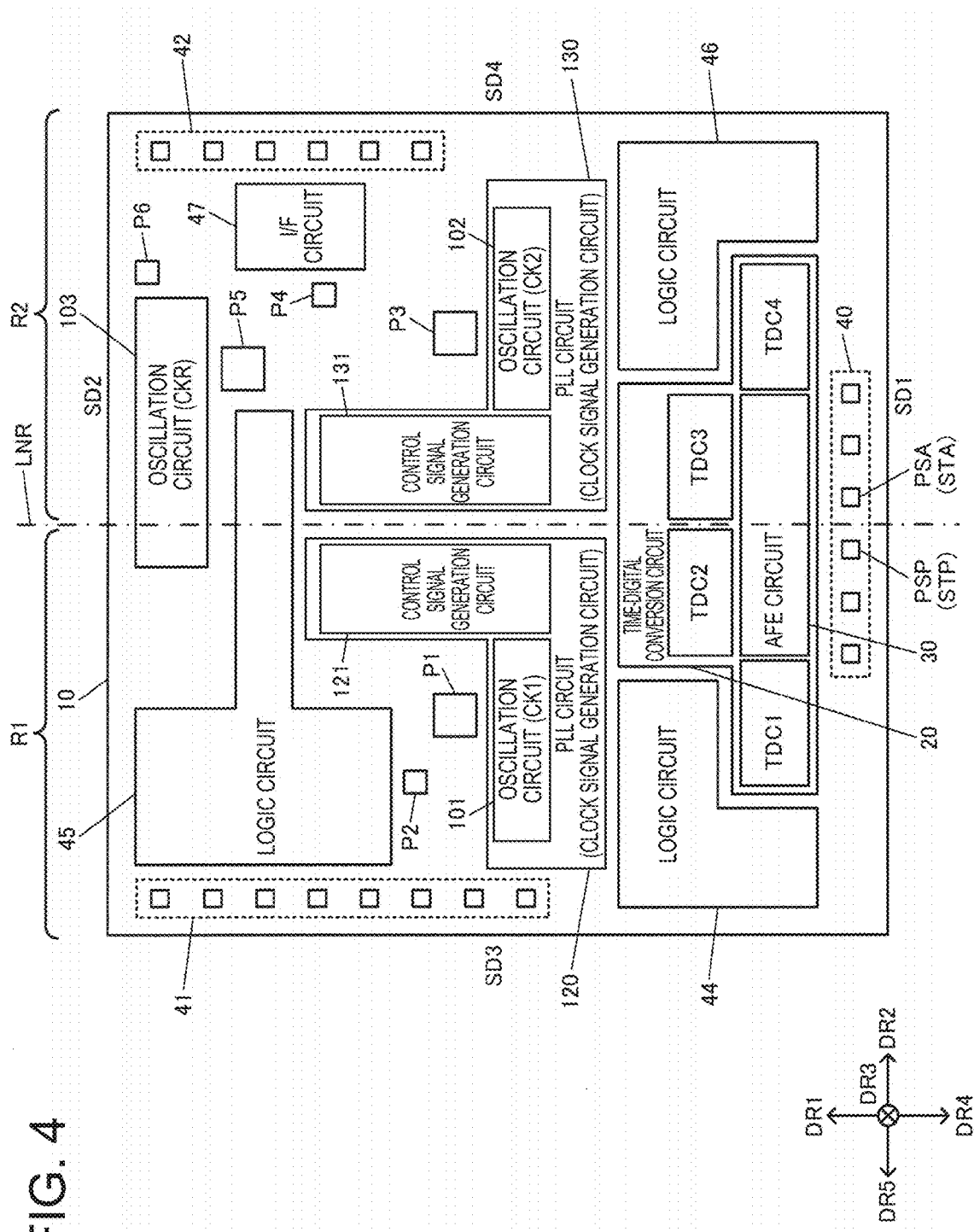
FIG. 4 illustrates a third detailed layout example of the integrated circuit device in the embodiment.

FIG. 4 illustrates a third detailed layout example of the integrated circuit device 10. In FIGS. 2 and 3, the time-digital conversion units TDC1 to TDC4 are disposed on the direction DR1 side of the AFE circuit 30. According to this configuration, the signal line from the AFE circuit 30 may be formed on the direction DR1 side and thus be connected to the time-digital conversion units TDC1 to TDC4. On the contrary, in FIG. 4, two time-digital conversion units TDC2 and TDC3 (K time-digital conversion units (K is an integer of 1 or greater)) among the time-digital conversion units TDC1 to TDC4 are disposed on the direction DR1 side of the AFE circuit 30. Two time-digital conversion units TDC1 and TDC4 (L time-digital conversion units (L is an integer of 1 or greater)) which are different from the time-digital conversion units TDC2 and TDC3 are disposed on the side of the AFE circuit 30 in the direction intersecting the direction DR1. The time-digital conversion unit TDC1 is disposed on the side of the direction DR5 intersecting the direction DR1, and the time-digital conversion unit TDC4 is disposed on the side of the direction DR2 intersecting the direction DR1. That is, it is not necessary that all components of the time-to-digital converter 20 are disposed on the direction DR1 side. A layout in which some components of the time-to-digital converter 20 are disposed on the side of the direction DR2 or DR5 intersecting the direction DR1 may be made. According to this configuration, it is possible to dispose the time-to-digital converter 20 by effectively using a space on the side of the direction DR2 or DR5 intersection the direction DR1 in addition to the direction DR1 side of the AFE circuit 30. The time-digital conversion units TDC1 and TDC4 may be disposed only on one side of the direction DR2 side and the direction DR5 side. It is not necessary that all the time-digital conversion units TDC1 to TDC4 are disposed to be adjacent to the AFE circuit 30. A modification in which some of the time-digital conversion units TDC1 to TDC4 are disposed to interpose a circuit block between the time-digital conversion units and the AFE circuit 30 may be made.

Figure 5:
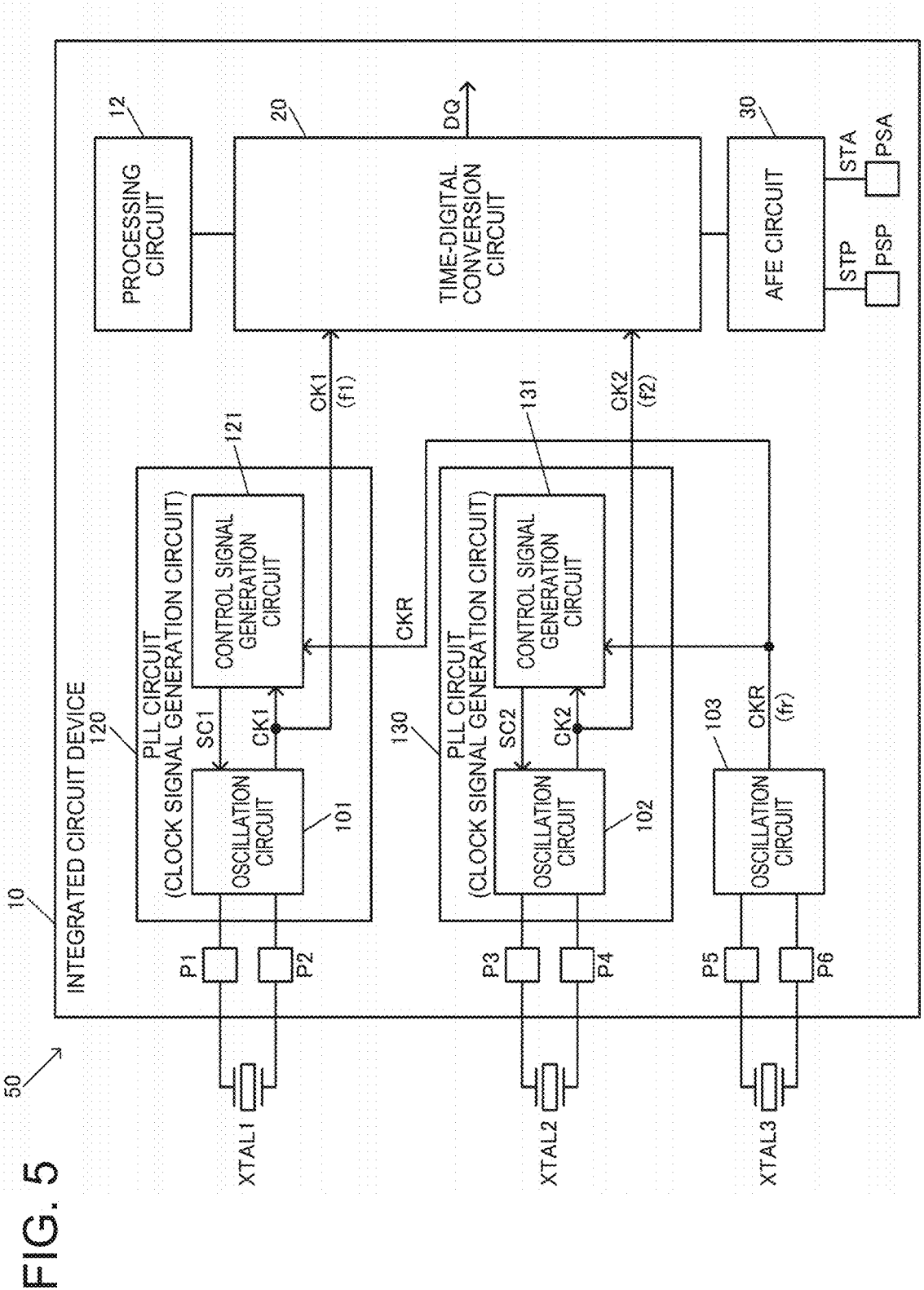
FIG. 5 illustrates a configuration example of the integrated circuit device and a physical quantity measuring device in the embodiment.

2. Configuration Example of Integrated Circuit Device and Physical Quantity Measuring Device FIG. 5 illustrates a configuration example of the integrated circuit device 10 and the physical quantity measuring device 50 including the integrated circuit device 10. The integrated circuit device 10 includes the AFE circuit 30, the time-to-digital converter 20, and the PLL circuits 120 and 130 (clock signal generation circuit in a broad sense). The integrated circuit device 10 may include the oscillation circuit 103, a processing circuit 12, the signal terminals PSA and PSP, and the oscillation terminal P1 to P6. The physical quantity measuring device 50 includes the resonators XTAL1 to XTAL3 and the integrated circuit device 10.

Figure 15:
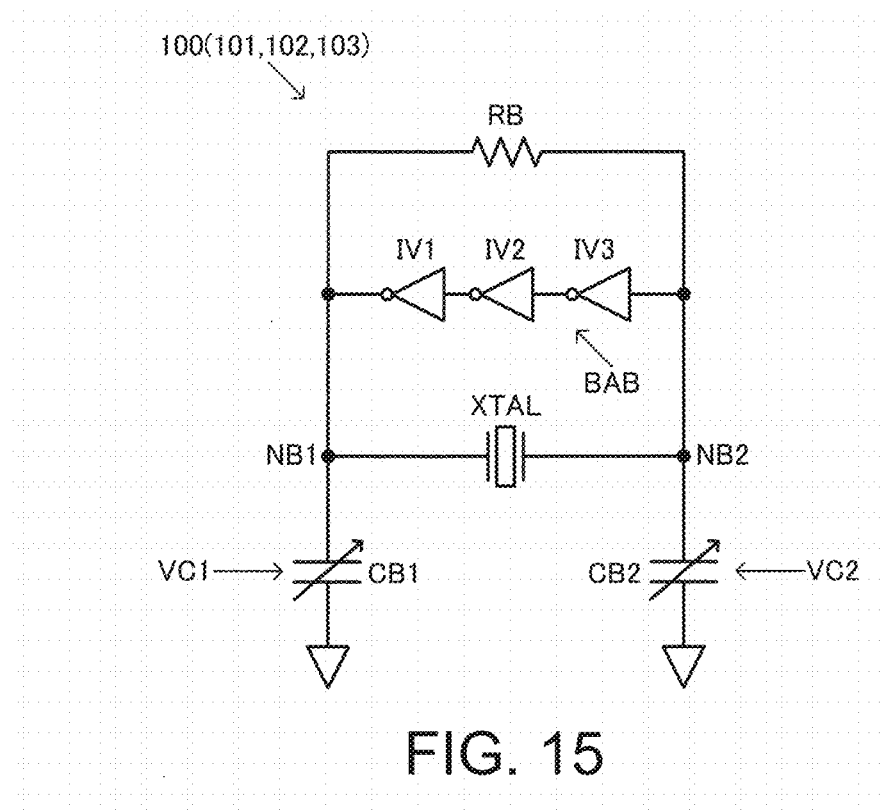
FIG. 15 illustrates a first configuration example of an oscillation circuit.
Figure 16:
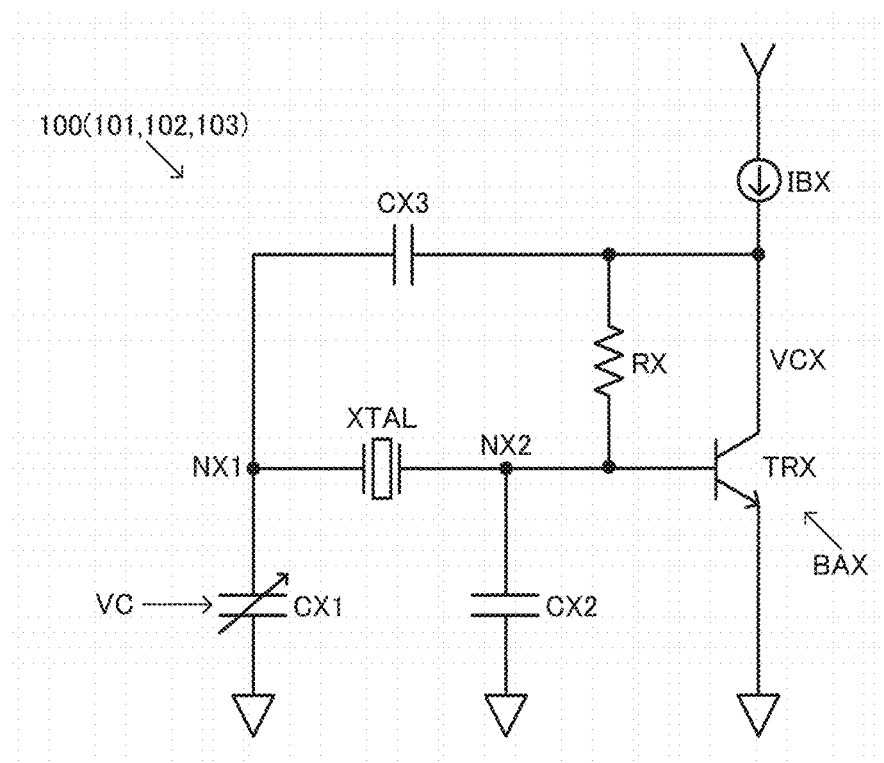
FIG. 16 illustrates a second configuration example of the oscillation circuit.

The AFE circuit 30 performs waveform shaping of the signal STA from the signal terminal PSA and waveform shaping of the signal STP from the signal terminal PSP. The time-to-digital converter 20 converts the time difference in transition timing between the signal STA subjected to waveform shaping and the signal STP subjected to waveform shaping, to a digital value DQ. The oscillation circuit 103 performs an oscillation operation of oscillating the resonator XTAL3 so as to generate the reference clock signal CKR having a clock frequency of fr. The PLL circuits 120 and 130 generate the clock signals CK1 and CK2 having phases synchronized with the reference clock signal CKR, respectively. Specifically, the control signal generation circuit 121 of the PLL circuit 120 outputs a control signal SC1 which is based on phase comparison between the clock signal CK1 from the oscillation circuit 101 and the reference clock signal CKR from the oscillation circuit 103, to the oscillation circuit 101 and thus causes the phase of the clock signal CK1 to be synchronized with the phase of the clock signal CKR. The control signal generation circuit 131 of the PLL circuit 130 outputs a control signal SC2 which is based on phase comparison between the clock signal CK2 from the oscillation circuit 102 and the reference clock signal CKR from the oscillation circuit 103, to the oscillation circuit 102 and thus causes the phase of the clock signal CK2 to be synchronized with the phase of the clock signal CKR. Since the phases of the clock signals CK1 and CK2 are synchronized with the reference clock signal CKR, the phase of the clock signals CK1 and CK2 are synchronized with each other and thus it is possible to hold a frequency relationship or a phase relationship between the clock signals CK1 and CK2 to be a predetermined relationship. For example, in a case where the clock frequencies of the clock signals CK1 and CK2 are set as f1 and f2, a control of holding a frequency relationship of N/f1=M/f2 (N and M are integers which are 2 or greater and different from each other) is performed by the PLL circuits 120 and 130 (synchronization circuit, control unit). If time-digital conversion is performed by using such clock signals CK1 and CK2, it is possible to perform time-digital conversion by setting the clock signals CK1 and CK2 to have an appropriate frequency relationship. Thus, it is possible to realize time-digital conversion having high performance. The processing circuit 12 performs various kinds of processing such as control processing or arithmetic processing of the integrated circuit device 10. The processing circuit 12 is realized by the logic circuits 44, 45, and 46 and the like in FIGS. 2 to 4. The oscillation circuits 101, 102, and 103 may include a power source circuit (regulator) that supplies power to the oscillation circuits and the like, in addition to circuit elements such as a buffer circuit, a resistor, and a capacitor which are illustrated in FIGS. 15 and 16 and will be described later.

Figure 6:
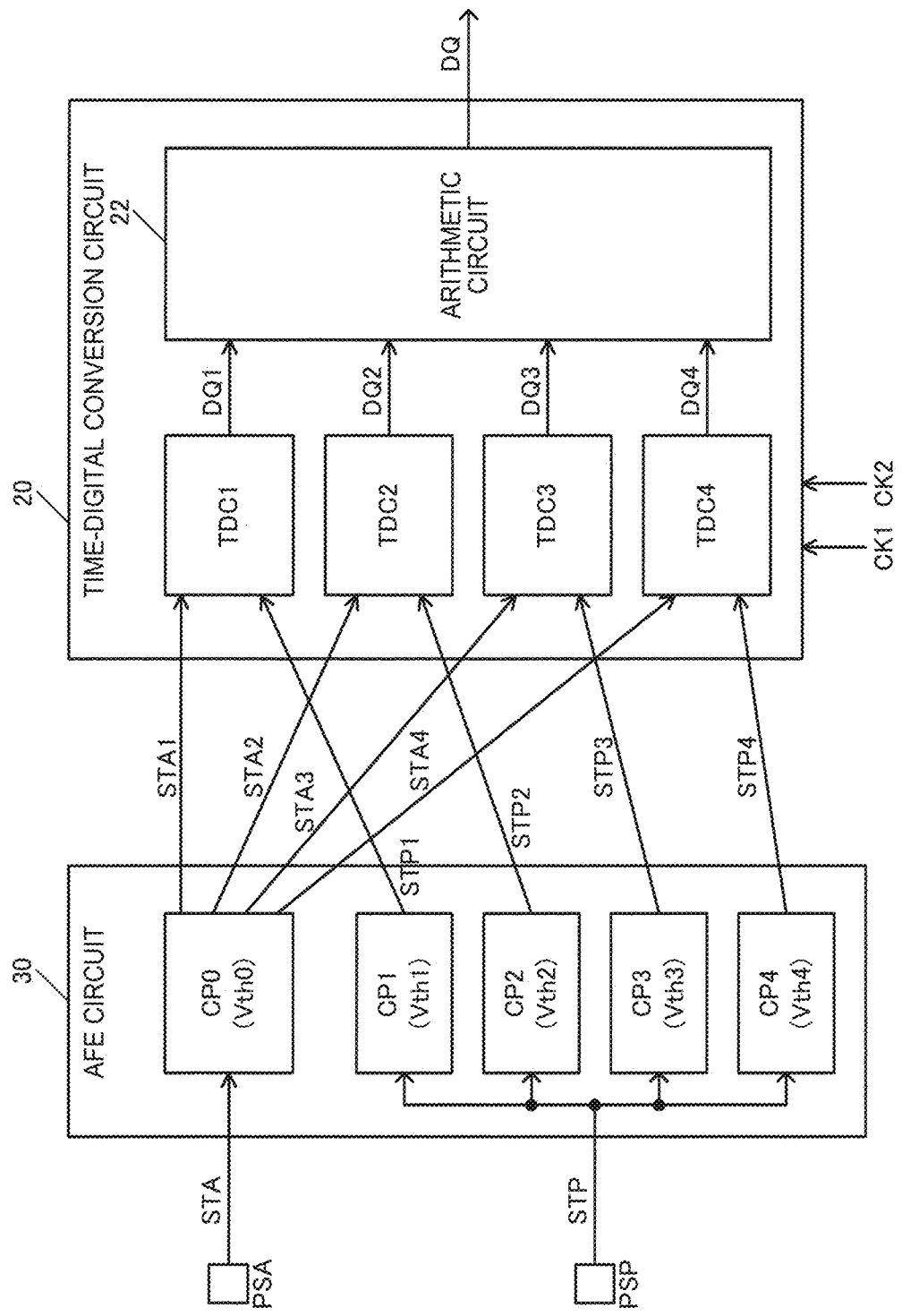
FIG. 6 illustrates a detailed configuration example of an AFE circuit and a time-to-digital converter.

FIG. 6 illustrates a detailed configuration example of the AFE circuit 30 and the time-to-digital converter 20. The AFE circuit 30 outputs stop signals STP1 to STP4 (first to n-th stop signals in a broad sense) by comparing the voltage level of the signal STP (second signal, stop signal) to a plurality of threshold voltages Vth1 to Vth4. The stop signals STP1 to STP4 are stop signals subjected to waveform shaping. The AFE circuit 30 outputs start signals STA1 to STA4 (first to n-th start signals in a broad sense) based on the signal STA (first signal, start signal). The start signals STA1 to STA4 are start signals subjected to waveform shaping. In a case of a spontaneous type, the start signal STA1 to STA4 are not input from the AFE circuit 30 but are generated in the time-to-digital converter 20.

The AFE circuit 30 includes a comparator circuit (waveform shaping circuit) CP0 and comparator circuits (waveform shaping circuit) CP1 to CP4.

The comparator circuit CP0 receives the input signal STA and outputs the start signals STA1 to STA4. The comparator circuits CP1 to CP4 receive the input signal STP and output the stop signal STP1 to STP4. The comparator circuit CP0 includes a comparator and first to fourth buffering circuits. The comparator compares the voltage level of the signal STA to a threshold voltage Vth0. The first to fourth buffering circuits buffer an output signal of the comparator and output the start signal STA1 to STA4. The comparator circuit CP1 includes a comparator and a buffering circuit. The comparator compares the voltage level of the signal STP to the threshold voltage Vth1. The buffering circuit buffers the output signal of this comparator and outputs the stop signal STP1. Similarly, the comparator circuits CP2, CP3, and CP4 include comparators that compare the voltage level of the signal STP to the threshold voltages Vth2, Vth3, and Vth4 and buffering circuits that buffer output signals of the comparators and output the stop signals STP2, STP3, and STP4, respectively. The time-digital conversion unit TDC1 performs processing of converting the time difference in transition timing between the start signal STA1 and the stop signal STP1 to a digital value, and thus outputs DQ1. Similarly, the time-digital conversion units TDC2, TDC3, and TDC4 perform processing of converting the time difference between transition timings of the start signals STA2, STA3, and STA4 and transition timings of the stop signals STP2, STP3, and STP4 to digital values, and thus output DQ2 to DQ4, respectively. The time-to-digital converter 20 includes an arithmetic circuit 22. The arithmetic circuit 22 performs arithmetic processing based on the output values DQ1 to DQ4 from the time-digital conversion units TDC1 to TDC4, so as to obtain a digital value DQ corresponding to the time difference in transition timing between the signals STA and STP.

The threshold voltages (first to fourth threshold voltages) Vth1 to Vth4 of the comparator circuits CP1 to CP4 are different from each other. For example, a relationship of Vth1<Vth2<Vth3<Vth4 is established. It is possible to obtain inclination information of the signal STP in a manner that the comparator circuits CP1 to CP4 perform voltage comparison of the signal STP to the threshold voltages Vth1 to Vth4 which are different from each other, as described above. Thus, since the arithmetic circuit 22 performs arithmetic processing based on the output values DQ1 to DQ4 of the time-digital conversion units TDC1 to TDC4, it is possible to specify an accurate transition timing of the signal STP by the inclination information of the signal STP and to obtain a digital value DQ corresponding to the time difference in transition timing between the signals STA and STP. In particular, since the signal STP input from a receiving device such as a light receiving unit has a blunt waveform in comparison to the signal STA, such arithmetic processing using the inclination information is effective.

3. Physical Quantity Measuring Device

FIGS. 7 and 8 illustrate a configuration example of the physical quantity measuring device (resonator device) 50. FIG. 7 is a plan view when the physical quantity measuring device 50 is viewed from the top. FIG. 8 is a perspective view when the physical quantity measuring device is obliquely viewed from the top. The physical quantity measuring device 50 includes the resonators XTAL1 to XTAL3 and the integrated circuit device 10. The number of resonators may be two or may be four or greater. In the embodiment, a direction directed from the integrated circuit device 10 to the resonators XTAL1 to XTAL3 is set to be an upward direction and the opposite direction is set to be a downward direction. For example, a lid portion side of a package 52 of the physical quantity measuring device 50 corresponds to the upward direction side and a bottom portion side corresponds to the downward direction side. The direction DR3 which is the downward direction is perpendicular to the board of the integrated circuit device 10.

The physical quantity measuring device 50 has the package 52. The package 52 has a box-like base portion 53 and a frame portion (surrounding portion) 54. The lid portion (not illustrated) is bonded to the upper surface of the frame portion 54. A recess portion is provided in the base portion 53 of the package 52. The resonators XTAL1 to XTAL3 and the integrated circuit device 10 are accommodated in an accommodation space S formed by the recess portion, and air-tightly sealed by the lid portion.

Step portions 60, 63, and 66 are provided at the inner circumferential portion of the frame portion 54 of the package 52. The recess portion of the base portion 53 has a two-stage structure (loft structure) of an inner bottom surface and the step portions 60, 63, and 66. The integrated circuit device 10 is mounted on the inner bottom surface thereof. A plurality of electrodes such as electrodes 61, 64, and 67 are formed at each of the step portions 60, 63, and 66. The electrodes 61, 64, and 67 are electrically connected to the corresponding terminals (pads) of the integrated circuit device 10 via bonding wires 62, 65, and 68. The electrodes 61, 64, and 67 are electrically connected to external connection terminals provided on an outer bottom surface (outside bottom surface) of the package 52, via an internal wire and the like of the package 52. Thus, the terminal of the integrated circuit device 10 is electrically connected to the external connection terminal.

The resonators XTAL1, XTAL2, and XTAL3 are realized, for example, by resonator elements (piezoelectric resonator elements) such as crystal resonator elements. For example, the resonators are realized by crystal resonator elements and the like which have a cut angle of AT cut, SC cut, or the like and performs thickness shear mode resonance. The resonators XTAL1, XTAL2, and XTAL3 in the embodiment are not limited thereto. For example, the resonators can be realized by various resonator elements such as resonator elements (other than a thickness shear mode type) or piezoelectric resonator elements formed of a material other than quartz crystal.

The resonator XTAL1 includes a substrate PS1 (piezoelectric substrate), an upper electrode EU1 (the other electrode in a broad sense), and a lower electrode ED1 (one electrode in a broad sense, and not illustrated). The substrate PS1 is a flat substrate formed of a piezoelectric material such as quartz. The upper electrode EU1 (front electrode) is formed on the upper surface (first main surface) of the substrate PS1. The lower electrode ED1 (back electrode) is formed on the lower surface (second main surface) of the substrate PS1. The upper electrode EU1 includes an excitation electrode XU1, a terminal electrode TU1, and a connection electrode of connecting the excitation electrode XU1 and the terminal electrode TU1. The lower electrode ED1 includes an excitation electrode XD1, a terminal electrode TD1, and a connection electrode which are not illustrated. The excitation electrodes XU1 and XD1 are provided to face each other with the substrate PS1 interposed between the excitation electrodes XU1 and XD1. The terminal electrodes TU1 and TD1 are provided to face each other with the substrate PS1 interposed between the terminal electrodes TU1 and TD1. Thus, resonance by thickness shear is realized by applying a voltage between the excitation electrodes XU1 and XD1. In this case, a structure in which the thickness of the substrate PS1 between the excitation electrodes XU1 and XD1 (thickness thereof in the direction DR3) is thin can be employed. As described above, the resonator XTAL1 in the embodiment has a structure in which the terminal electrodes TU1 and TD1 and the connection electrode are formed on the substrate PS1 so as to be adhered to the substrate PS1 (by being stacked or by vapor deposition) in addition to the excitation electrodes XU1 and XD1. The resonator XTAL2 includes a substrate PS2, an upper electrode EU2 (the other electrode), and a lower electrode ED2 (one electrode). The upper electrode EU2 includes an excitation electrode XU2, a terminal electrode TU2, and a connection electrode. The lower electrode ED2 includes an excitation electrode XD2, a terminal electrode TD2, and a connection electrode. The resonator XTAL3 includes a substrate PS3, an upper electrode EU3 (the other electrode) and a lower electrode ED3 (one electrode). The upper electrode EU3 includes an excitation electrode XU3, a terminal electrode TU3, and a connection electrode. The lower electrode ED3 includes an excitation electrode XD3, a terminal electrode TD3, and a connection electrode. For example, the electrode structures of the resonators XTAL2 and XTAL3 are similar to that of the resonator XTAL1, and detailed descriptions thereof will not be repeated. The lower electrodes ED1, ED2, and ED3 as the one electrode are, for example, electrodes on the third direction side (integrated circuit device side). The upper electrodes EU1, EU2, and EU3 as the other electrode are, for example, electrodes on a fourth direction side which is a direction opposite to the third direction (DR3).

Figure 9:
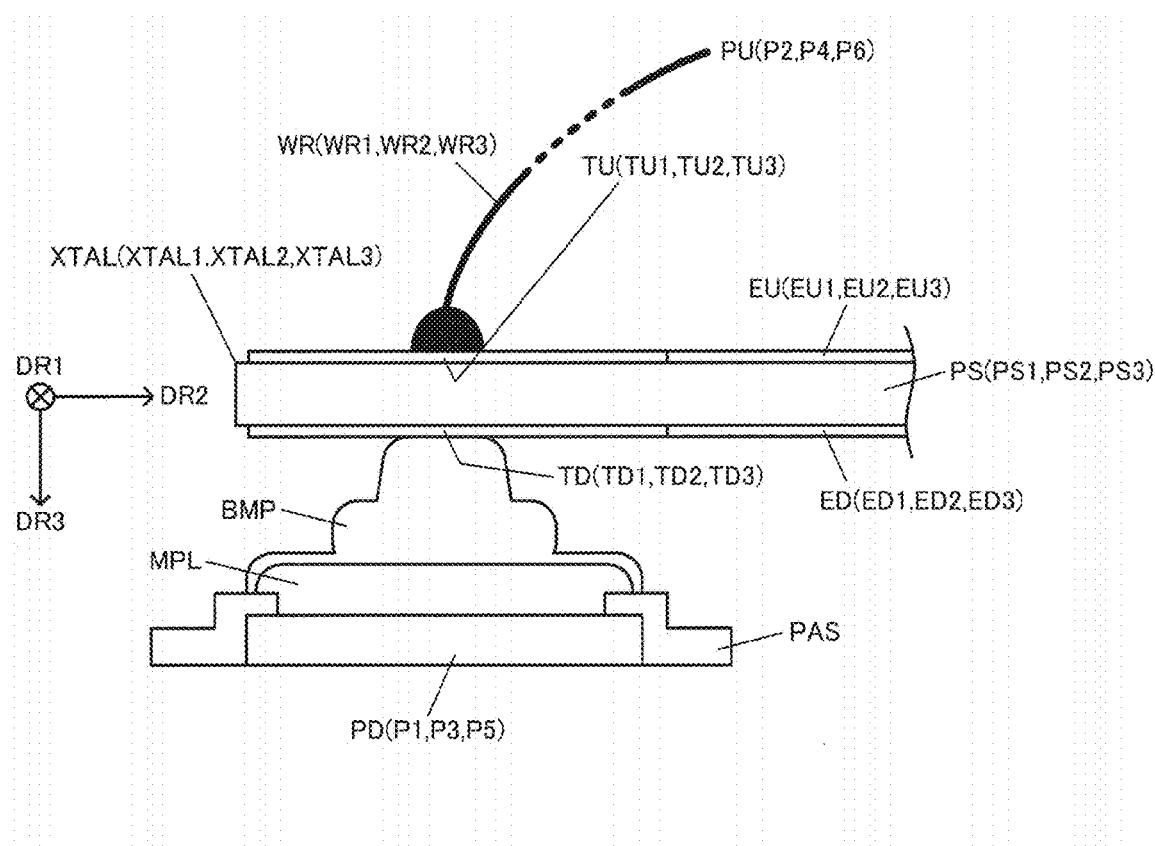
FIG. 9 is a sectional view illustrating a detailed example of bump connection.

In the physical quantity measuring device 50 in the embodiment, as illustrated in FIG. 9 which will be described later, the terminal P1 of the integrated circuit device 10 is connected to the lower electrode ED1 of the resonator XTAL1 with a bump. The terminal P3 of the integrated circuit device 10 is connected to the lower electrode ED2 of the resonator XTAL2 with a bump. The terminal P5 of the integrated circuit device 10 is also connected to the lower electrode ED3 of the resonator XTAL3 with the bump. For example, connection using a conductive bump (BMP in FIG. 9) such as a metal bump is performed. The bump is a protruding connection electrode formed on the terminal. The bump connection is a method of connecting terminals via a bump which is a metal protrusion (conductive protrusion), with the terminals being opposed to each other. The bump connection has an advantage, for example, that the connection length can be reduced, in comparison to wire-bonding connection. The bump may be, for example, a resin core bump in which a core of a bump, which is formed by resin is plated with metal.

FIG. 9 is a sectional view illustrating a detailed example of bump connection. As illustrated in FIG. 9, the terminal PD (P1, P3, and P5) of the integrated circuit device 10 is electrically connected to the lower electrode ED (ED1, ED2, and ED3) of the resonator XTAL (XTAL1, XTAL2, and XTAL3) via a bump BMP. Specifically, an opening (pad opening) for exposing the terminal PD is formed in a passivation film PAS of the integrated circuit device 10. A multi-plating layer MPL made of Ni/Pd/Au and the like is formed on the terminal PD and the bump BMP (Au bump) is formed on the plating layer MPL. It is possible to improve connection strength by forming the plating layer MPL between the terminal PD and the bump BMP in this manner. The bump BMP formed on the terminal PD is connected to the terminal electrode TD (TD1, TD2, and TD3) of the lower electrode ED in the resonator XTAL. One end of the bonding wire WR (WR1, WR2, and WR3) is connected to the terminal electrode TU (TU1, TU2, and TU3) of the upper electrode EU (EU1, EU2, and EU3) above the terminal electrode TD. The other end of the bonding wire WR is connected to the terminal PU (P2, P4, and P6) of the integrated circuit device 10. For example, as illustrated in FIGS. 7 and 8, the bonding wires WR1 and WR2 are connected to the terminals P2 and P4 of the oscillation circuits 101 and 102 in the integrated circuit device 10, respectively. The bonding wire WR3 is connected to the terminal P6 of the oscillation circuit 103. With this configuration, the terminals P1 and P2 of the oscillation circuit 101 can be respectively connected to the upper electrode EU1 (TU1) and the lower electrode ED1 (TD1) of the resonator XTAL1 and the terminals P3 and P4 of the oscillation circuit 102 can be respectively connected to the upper electrode EU2 (TU2) and the lower electrode ED2 (TD2) of the resonator XTAL2. The terminals P5 and P6 of the oscillation circuit 103 can be connected to the upper electrode EU3 (TU3) and the lower electrode ED3 (TD3) of the resonator XTAL3, respectively.

As described above, according to the physical quantity measuring device 50 in FIGS. 7 and 8, it is possible to mount the lower electrodes ED1 to ED3 of the resonators XTAL1 to XTAL3 on the terminals P1 to P3 of the integrated circuit device 10 by bump connection. Thus, a plurality of resonators XTAL1 to XTAL3 can be mounted just above the integrated circuit device 10 and it is possible to realize a small physical quantity measuring device 50 which is capable of compactly accommodating the resonators XTAL1 to XTAL3 and the integrated circuit device 10 in the package 52. Here, being mounted just above the device means that the resonators XTAL1 to XTAL3 are mounted over the integrated circuit device 10 without interposing a member or an element between the integrated circuit device 10 and the resonators XTAL1 to XTAL3, for example. For example, in side view (direction DR1), the integrated circuit device 10 and the resonators XTAL1 to XTAL3 are disposed such that the integrated circuit device 10 is parallel (substantially parallel) to the resonators XTAL1 to XTAL3 and the main surface of the integrated circuit device 10 faces the main surfaces of the resonators XTAL1 to XTAL3. A distance between the main surface of the integrated circuit device 10 and the main surfaces of the resonators XTAL1 to XTAL3 is short and corresponds to the height of the bump BMP.

For example, in the related art, it is difficult to realize a small physical quantity measuring device in which a plurality of resonators is mounted, due to the area or wiring of a mounting portion of a package. On the contrary, in the embodiment, the plurality of resonators XTAL1 to XTAL3 can be disposed just above the integrated circuit device 10 by using the portion at which bump connection is performed, as the support portions. For example, as illustrated in FIG. 7, the plurality of resonators XTAL1 to XTAL3 may be mounted so as to overlap the integrated circuit device 10 in plan view. Thus, the integrated circuit device 10 and the resonators XTAL to XTAL3 can be mounted by effectively utilizing the limited accommodation space S of the package 52, and thus it is possible to realize a physical quantity measuring device 50 obtained by compactly accommodating the resonators XTAL to XTAL3 in one package 52.

In FIGS. 7 and 8, the terminal P2 of the integrated circuit device 10 is connected to the upper electrode EU1 of the resonator XTAL1 by the bonding wire WR1. The terminal P4 of the integrated circuit device 10 is connected to the upper electrode EU2 of the resonator XTAL2 by the bonding wire WR2. The terminal P6 of the integrated circuit device 10 is connected to the upper electrode EU3 of the resonator XTAL3 by the bonding wire WR3. As described above, in FIGS. 7 and 8, bump connection is performed between the terminal PD (P1, P3, and P5) of the integrated circuit device 10 and the lower electrode ED (ED1 to ED3) of the resonator XTAL (XTAL1 to XTAL3) and wire-bonding connection is performed between the terminal PU (P2, P4, and P6) and the upper electrode EU (EU1 to EU3). According to this configuration, it is possible to realize thickness shear resonance and the like of the resonator XTAL in a manner that the oscillation circuit 100 (101 to 103) is connected between the terminals PD and PU of the integrated circuit device 10 and a voltage is applied between the lower electrode ED and the upper electrode EU of the resonator XTAL. Since the oscillation circuit 100 and the resonator XTAL are disposed to overlap each other in plan view, it is possible to reduce the length of the bonding wire WR (WR1 to WR3) and to reduce unnecessary parasitic resistance or parasitic capacitance.

In FIGS. 7 and 8, the terminal electrode TU1 of the upper electrode EU1 and the terminal electrode TD1 of the lower electrode ED1 in the resonator XTAL1 overlap the terminal P1 of the integrated circuit device 10 in plan view (overlap at least a portion of the terminal P1 of the integrated circuit device 10). The terminal electrode TU2 of the upper electrode EU2 and the terminal electrode TD2 of the lower electrode ED2 in the resonator XTAL2 overlap the terminal P3 of the integrated circuit device 10 in plan view. That is, as illustrated in FIG. 9, wire-bonding connection is performed just above the place (position of BMP) in which bump connection is performed. The above descriptions are similarly applied to the resonator XTAL3. According to this configuration, the resonator XTAL (XTAL1 to XTAL3) can be mounted just above the integrated circuit device 10 with being supported at a single point in the place in which bump connection is performed. For example, the resonator XTAL can be resonated by using the place in which bump connection is performed, as a fixed end. For example, if the resonator XTAL is supported at two points, thermal stress caused by, for example, a difference of a thermal expansion coefficient between the resonator XTAL and the integrated circuit device 10 may be applied and thus characteristics of the resonator XTAL or the integrated circuit device 10 may be affected. At this point, as illustrated in FIG. 9, if the resonator XTAL is mounted with being supported at a single point in the place in which bump connection is performed, it is possible to suppress an occurrence of such thermal stress and to reduce degradation of the characteristics and the like occurring due to the thermal stress.

In the embodiment, the terminals (first to sixth oscillation terminals) P1 to P6 of the integrated circuit device 10 are disposed as follows. That is, in plan view in the direction perpendicular to (intersecting) the board of the integrated circuit device 10, the terminal P1 is disposed at a position overlapping the resonator XTAL1, and the terminal P2 is disposed at a position which does not overlap the resonator XTAL1. The terminal P3 is disposed at a position overlapping the resonator XTAL2, and the terminal P4 is disposed at a position which does not overlap the resonator XTAL2. The terminal P5 is disposed at a position overlapping the resonator XTAL3, and the terminal P6 is disposed at a position which does not overlap the resonator XTAL3. Since the terminals P1 to P6 are disposed in this manner, as described above, the terminal P1 can be connected to the lower electrode ED1 of the resonator XTAL1 with a bump, and the terminal P2 can be connected to the upper electrode EU1 of the resonator XTAL1 by wire-bonding connection. The terminal P3 can be connected to the lower electrode ED2 of the resonator XTAL2 with a bump, and the terminal P4 can be connected to the upper electrode EU2 of the resonator XTAL2 by wire-bonding connection. The terminal P5 can be connected to the lower electrode ED3 of the resonator XTAL3 with a bump, and the terminal P6 can be connected to the upper electrode EU3 of the resonator XTAL3 by wire-bonding connection. Thus, an efficient arrangement in which the resonators XTAL1 to XTAL3 are mounted in the integrated circuit device 10 can be made.

In the embodiment, as illustrated in FIGS. 7 and 8, the terminal P1 has an area larger than that of the terminal P2, and the terminal P3 has an area larger than that of the terminal P4. The terminal P5 has an area larger than that of the terminal P6. As described above, in the embodiment, the terminals P1, P3, and P5 on which bump connection is performed have areas larger than the terminals P2, P4, and P6 on which wire-bonding connection is performed. The area of each of the terminals P1, P3, and P5 is about twice the area of each of the terminals P2, P4, and P6. As described above, connection strength of the bump connection is improved, or parasitic resistance is reduced, by setting the areas of the terminals P1, P3, and P5 to be large. It is possible to realize appropriate single point support and the like of the resonator by using a portion on which bump connection is performed, as the support portion.

The descriptions of a case where one terminal PD of the integrated circuit device 10 is connected to the lower electrode ED of the resonator XTAL with the bump and the other terminal PU is connected to the upper electrode EU is made above. However, the embodiment is not limited thereto. For example, both the terminals PD and PU of the integrated circuit device 10 may be connected to the lower electrode ED of the resonator XTAL with the bump. According to this configuration, the resonator XTAL can be mounted in two places in which the bump connection of the terminals PD and PU of the integrated circuit device 10 is performed, with being supported at two points. Thus, it is possible to omit the step of wire-bonding connection and to prevent degradation of the performance occurring due to parasitic resistance or parasitic capacitance of the bonding wire.

In FIGS. 7 and 8, the resonators XTAL1 and XTAL2 are disposed to cause the longitudinal direction thereof to be the direction DR1 in plan view. That is, the resonators XTAL1 and XTAL2 are mounted over the integrated circuit device 10 so as to cause the longitudinal direction to be along the direction DR1. The resonator XTAL3 is disposed to cause the longitudinal direction to be the direction DR2 intersecting with (perpendicular to) the direction DR1 in plan view. According to this configuration, the three resonators XTAL1 to XTAL3 can be disposed with being efficiently mounted on the rectangular integrated circuit device 10 and it is possible to realize, for example, size reduction of the physical quantity measuring device 50.

4. Time-Digital Conversion

Figure 10:
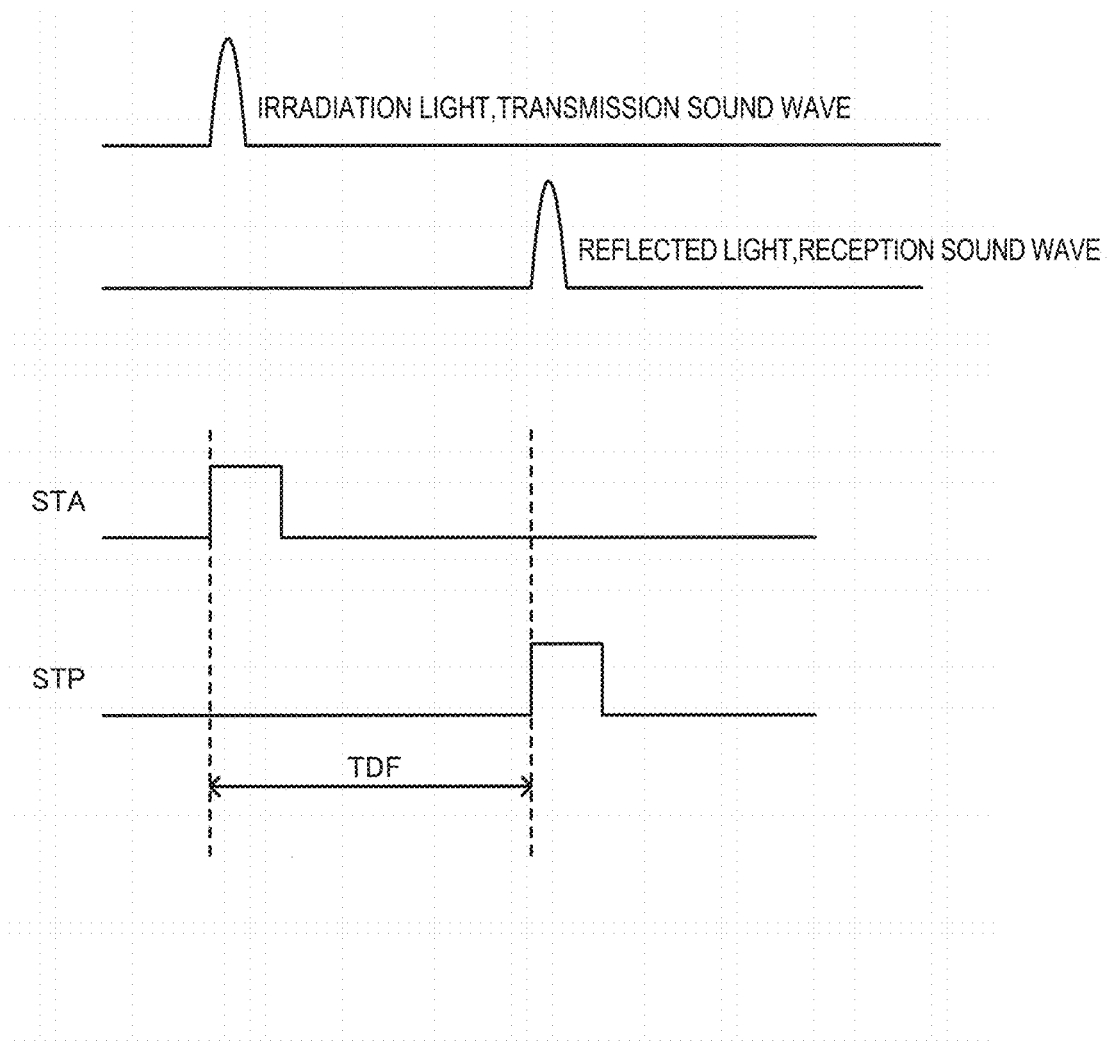
FIG. 10 is a diagram illustrating an example of measuring a physical quantity by using signals.

Next, a detailed example of time-digital conversion will be described. FIG. 10 is a diagram illustrating a relationship between the signal STA (start signal) and the signal STP (stop signal). The time-to-digital converter 20 converts a time difference TDF in transition timing between the signals STA and STP into a digital value DQ. In FIG. 10, TDF indicates a time difference between transition timings when the signals STA and STP rise (between rising edges). However, TDF may indicate a time difference between transition timings when the signals STA and STP fall (between falling edges). For example, in the embodiment, as illustrated in FIG. 10, irradiation light (for example, laser light) is emitted to a target (for example, object around a car) by using the signal STA. The signal STP is generated by receiving reflected light from the target. For example, the signal STP is generated by shaping the waveform of a received light signal. According to this configuration, it is possible to measure a distance from the target as the physical quantity, for example, in a manner of time of flight (TOF), by converting a time difference TDF in transition timing between the signals STA and STP into a digital value DQ. Thus, it is possible to use the measured distance for automated driving of cars and motion control of robots, for example. Alternatively, in the embodiment, a transmission sound wave (for example, ultrasonic wave) is transmitted to a target (for example, living body) by using the signal STA. The signal STP is generated by receiving a reception sound wave from the target. According to this configuration, it is possible to measure a distance and the like from the target and to, for example, measure biological information by the ultrasonic wave. In FIG. 10, transmission data may be transmitted by the signal STA. A time from the transmission data is transmitted until reception data is received may be measured by the signal STP generated by receiving the reception data. The physical quantity measured in the embodiment is not limited to the time and the distance. Various kinds of physical quantities such as a flow quantity, a flow rate, a frequency, a velocity, acceleration, an angular velocity, and angular acceleration are considered.

Figure 11:
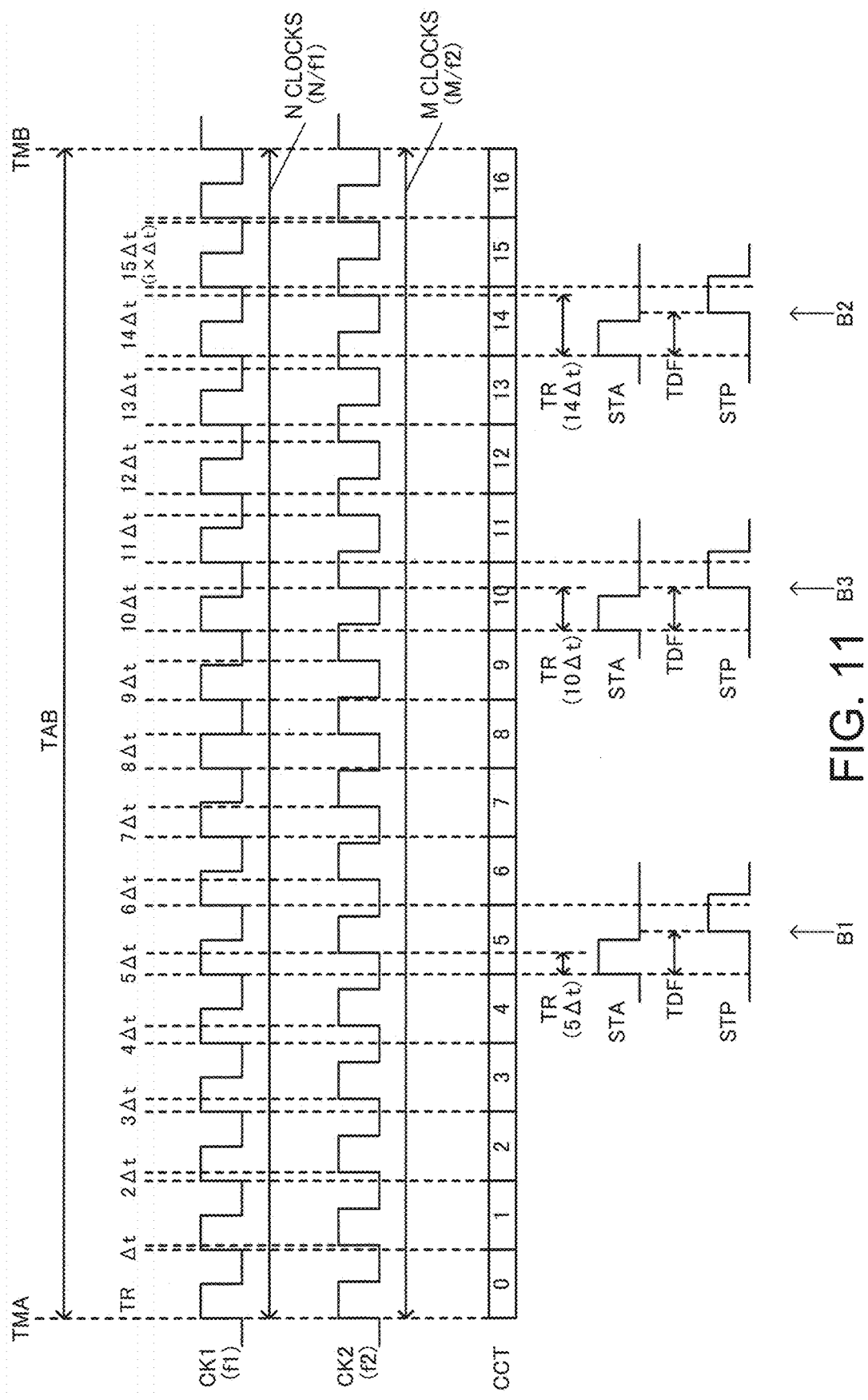
FIG. 11 is a signal waveform diagram illustrating an example of time-digital conversion.

FIG. 11 is a signal waveform diagram illustrating a time-digital conversion method in the embodiment. Phase synchronization between clock signals CK1 and CK2 is performed at a phase synchronization timing TMA and transition timings of the clock signals CK1 and CK2 coincide with each other. Then, the time difference TR (phase difference) between clocks of the clock signals CK1 and CK2 is increased for each clock cycle (CCT) by Δt so as to come to Δt, 2Δt, 3Δt, . . . . For example, phase synchronization between the clock signals CK1 and CK2 is performed at the next phase synchronization timing TMB and transition timings of the clock signals CK1 and CK2 coincide with each other.

In the embodiment, a time is converted to a digital value by using a plurality of resonators XTAL1 and XTAL2 and using the clock frequency difference therebetween. That is, the time-to-digital converter 20 converts a time into a digital value at resolution corresponding to the frequency difference (|f1−f2|) between the clock frequencies f1 and f2. The time-to-digital converter converts the time into the digital value by using the principle of a Vernier caliper, for example. According to this configuration, resolution of time-digital conversion can be set by using the frequency difference (|f1−f2|), and thus it is possible to, for example, improve performance of time-digital conversion, such as accuracy or resolution. Specifically, the resolution (time resolution) in time-digital conversion can be represented by Δt=||/f1−1/f2|=|f1−f2|/(f1×f2). Thus, the time-to-digital converter 20 converts a time into a digital value at resolution Δt satisfying Δt=|1/f1−1/f2|=|f1−f2|/(f1×f2). The resolution is represented by Δt=|f1−f2|/(f1×f2) and corresponds to the frequency difference (|f1−f2|).

According to this configuration, the resolution in time-digital conversion can be set by setting the clock frequencies f1 and f2. For example, it is possible to reduce the resolution Δt by reducing the frequency difference (|f1−f2|), and to realize time-digital conversion having high resolution. It is possible to reduce the resolution Δt by setting the clock frequencies f1 and f2 to be high frequencies, and to realize time-digital conversion having high resolution. If the clock signals CK1 and CK2 are generated by the resonators XTAL1 and XTAL2, accuracy of time-digital conversion is also improved in comparison to a case using a delay element of a semiconductor element. In particular, in the embodiment, since crystal resonators are used as the resonators XTAL1 and XTAL2, it is possible to suppress fluctuation in the clock frequencies f1 and f2 occurring by manufacturing variation or environmental fluctuation such as temperature fluctuation, to the minimum. Thus, it is possible to also suppress fluctuation of the resolution Δt=|f1−f2|/(f1×f2) to the minimum and to realize further improvement of the performance of time-digital conversion.

As illustrated in FIG. 11, the length of a period TAB between the phase synchronization timings TMA and TMB corresponds to N clocks of the clock signal CK1. The length of the period TAB corresponds to M clocks of the clock signal CK2. Here, N and M are integers of 2 or greater, which are different from each other. In FIG. 11, N is set to 17, M is set to 16, and N-M=1 is satisfied. A relationship of TAB=N/f1=M/f2 is established. If f2 is set to 16 MHz, N is set to 17, and M is set to 16, f1 comes to 17 MHz and a relational expression of N/f1=M/f2 is established. For example, at least one of the oscillation circuits 101 and 102 is controlled to establish the relationship of N/f1=M/f2. According to this configuration, the transition timings of the clock signals CK1 and CK2 coincide with each other at the phase synchronization timing TMA, and then the time difference TR between clocks is increased by Δt so as to come to Δt, 2Δt, 3Δt, . . . . Thus, the transition timings of the clock signals CK1 and CK2 coincide with each other at the next phase synchronization timing TMB and thus the time difference TR between clocks is 0. Then, the time difference TR between clocks is increased for each clock cycle by Δt.

As described above, the time difference TR is 0 at the phase synchronization timing and then the time difference TR between clocks is made by increasing the time difference TR by Δt (resolution). Thus, it is possible to realize time-digital conversion in which a time is converted into a digital value at the resolution Δt. In the processing of time-digital conversion at the resolution Δt, as illustrated in FIG. 11, the time difference TR between clocks in each clock cycle (CCT) in the period TAB can be uniquely specified. Thus, the processing of time-digital conversion or a circuit configuration is simplified. The accuracy of time-digital conversion is also improved by causing transition timings of the clock signals CK1 and CK2 coinciding (substantially coinciding) with each other at the phase synchronization timings TMA and TMB.

For example, in the above-described method of the related art disclosed in JP-A-5-87954, a method of establishing the relationship of N/f1=M/f2 as a relationship between the clock frequencies on the design of the first and second crystal resonators is considered. However, the clock frequencies by the first and second crystal resonators fluctuate due to manufacturing variation or environmental fluctuation such as temperature fluctuation. Thus, even though the relationship of N/f1=M/f2 is established on the design, the relationship of N/f1=M/f2 is not established for practical products. Thus, a shift or the like occurs in the transition timing and conversion accuracy of time-digital conversion is degraded.

On the contrary, in the embodiment, even in a case where the clock frequency fluctuates by manufacturing variation or environmental fluctuation, for example, at least one of the oscillation circuits 101 and 102 is controlled by the PLL circuits 120 and 130 (synchronization circuits) so as to cause the clock signals CK1 and CK2 to have a given frequency relationship or phase relationship. Thus, the frequency relationship or the phase relationship between the clock signals CK1 and CK2 is adjusted such that the fluctuation caused by the manufacturing variation or environmental fluctuation is compensated. Thus, even in a case where such fluctuation occurs, it is possible to realize appropriate time-digital conversion. It is possible to prevent degradation of conversion accuracy occurring by shift of the transition timings of the clock signals CK1 and CK2 at the phase synchronization timings TMA and TMB. Thus, the performance of time-digital conversion is improved.

As described above, in the embodiment, the oscillation circuits are controlled to establish the relational expression of N/f1=M/f2. The resolution in time-digital conversion is represented by a relational expression of $\Delta t=|f1-f2|/(f1 \times f2)$. Thus, Expression (1) is established.

$$\Delta t = |N-M|/(N \times f2) = |N-M|/(M \times f1) \quad (1)$$

According to this configuration, the clock signals CK1 and CK2 can be generated by setting N, M, and the like in accordance with the resolution $\Delta t$ required for time-digital conversion. For example, it is assumed that resolution of $\Delta t=2$ ns (nanoseconds) is required as the resolution in time-digital conversion and the clock frequency f2 of the clock signal CK2 is 100 MHz. In this case, it is possible to realize time-digital conversion at the resolution $\Delta t$ satisfying $|5-4|/(5 \times f2)=2$ ns by setting N to 5 and M to 4 in Expression (1). At this time, the clock frequency f1 of the clock signal CK1 satisfies $(N/M) \times f2=125$ MHz based on the relational expression of N/f1=M/f2. In addition, it is assumed that resolution of $\Delta t=1$ ps (picoseconds) is required as the resolution in time-digital conversion and the clock frequency f2 of the clock signal CK2 is 122.865 MHz. In this case, it is possible to realize time-digital conversion at the resolution $\Delta t$ satisfying $|8139-8138|/(8139 \times f2)=1$ ps by setting N to 8139 and M to 8138 in Expression (1). At this time, the clock frequency f1 of the clock signal CK1 satisfies $(N/M) \times f2=122.880$ MHz based on the relational expression of N/f1=M/f2.

In FIG. 11, after the phase synchronization timing TMA, a time difference TR between clocks, which is a time difference between the transition timings of the clock signals CK1 and CK2 in the first to i-th clock cycles (i is an integer of 2 or greater) is $\Delta t$ to $i \times \Delta t$. For example, TR is $\Delta t$ in the first clock cycle (CCT=1) after the phase synchronization timing TMA. Similarly, TR is $2\Delta t$ to $15\Delta t$ in the second to the 15th clock cycles (CCT=2 to 15). That is, the time difference TR between clocks in the j-th clock cycle ($1 \leq j \leq i$) is $j \times \Delta t$.

In this case, in the embodiment, a digital value DQ corresponding to the time difference TR is obtained in a manner that one of $\Delta t$ to $i \times \Delta t$ as the time difference TR between clocks regarding transition timings of the clock signals CK1 and CK2 corresponds to the time difference TDF between the transition timings of the signals STA and STP. For example, TR is $5\Delta t$ in a clock cycle (CCT=5) indicated by B1 in FIG. 11. The time difference TDF between the signals STA and STP is longer than TR=$5\Delta t$ and TDF>TR=$5\Delta t$ is satisfied. TR is $14\Delta t$ in a clock cycle (CCT=14) indicated by B2. TDF is shorter than TR=$14\Delta t$ and TDF<TR=$14\Delta t$ is satisfied. TR is $10\Delta t$ in a clock cycle (CCT=10) indicated by B3. TDF is equal to (substantially the same as) TR=$10\Delta t$ and TDF=TR=$10\Delta t$ is satisfied. Thus, the time difference TDF between the signals STA and STP is specified to correspond to TR=$10\Delta t$. As a result, it can be determined that the digital value DQ corresponding to the time difference TDF is, for example, a digital value corresponding to TR=$10\Delta t$. According to this configuration, it is possible to realize time-digital conversion in which the time difference TDF between the signals STA and STP is obtained by using the time difference TR between clocks increasing by $\Delta t$, after the phase synchronization timing TMA.

Figure 12:
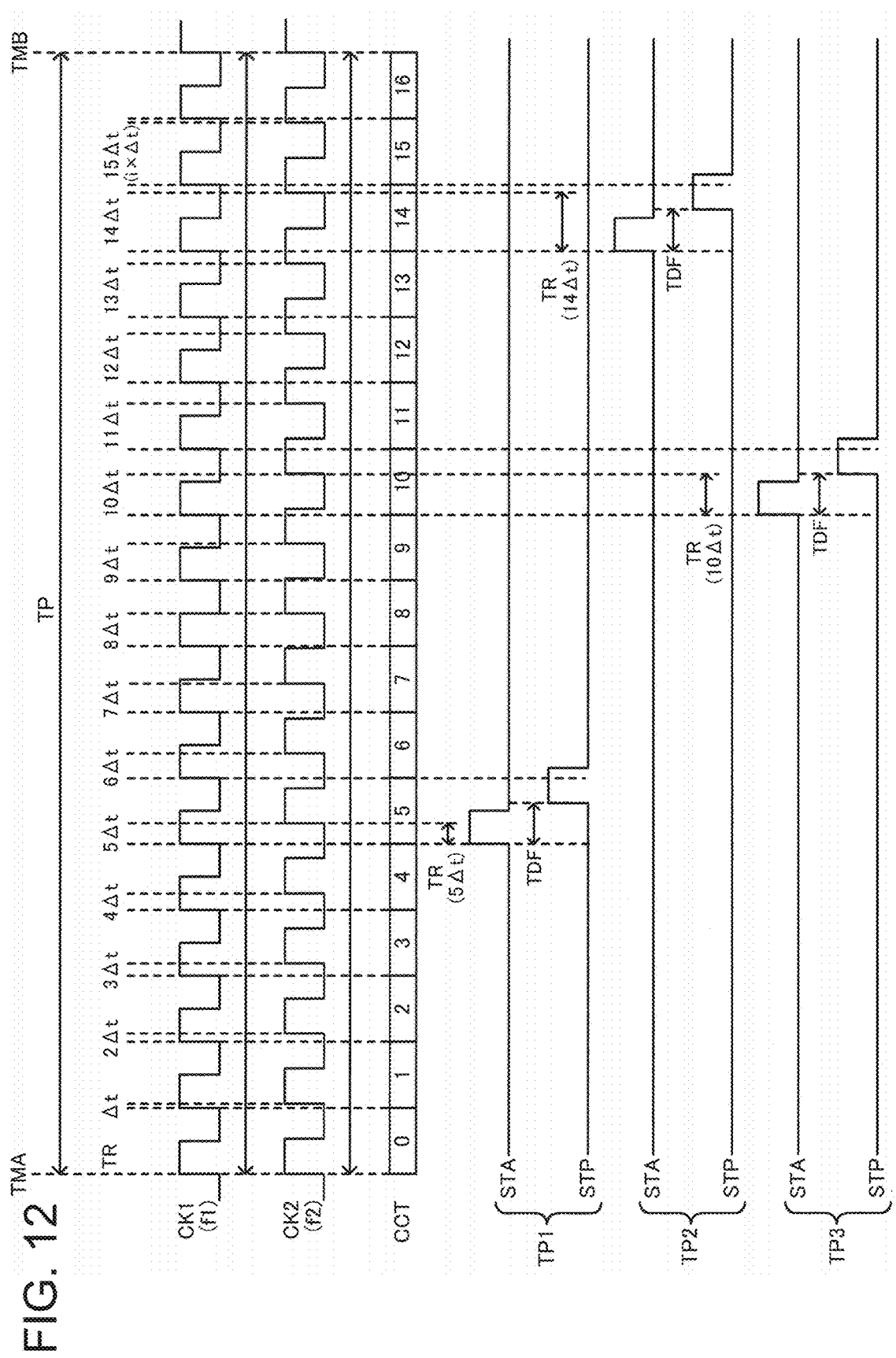
FIG. 12 is a signal waveform diagram illustrating a specific method of time-digital conversion.

FIG. 12 illustrates an example of a specific method of time-digital conversion in embodiment. For example, a period between the phase synchronization timings TMA and TMB is set to be an update period TP. Specifically, a period between first and second phase synchronization timings for the clock signals CK1 and CK2 is an update period TP1, a period between second and third phase synchronization timings is an update period TP2, and a period between third and fourth phase synchronization timings is an update period TP3. The update period TP2 is an update period next to the update period TP1 and the update period TP3 is an update period next to the update period TP2. The subsequent update periods are similar.

In this case, the time-to-digital converter 20 generates the signal STA, for example, in the fifth clock cycle (m-th clock cycle and m is an integer of 1 or greater) in the update period TP1. Then, the time-to-digital converter 20 acquires the signal STP which corresponds to the generated signal STA and has a changed signal level. Processing of comparing the time difference TDF between the signals STA and STP in the fifth clock cycle to the time difference TR=$5\Delta t$ between clocks is performed. Here, the result of the comparison processing in that TDF is longer than TR=$5\Delta t$ is obtained.

The time-to-digital converter 20 generates the signal STA in the 14th clock cycle (n-th clock cycle and n is an integer of 1 or greater. m and n are integers different from each other) set in accordance with the result of the comparison processing in the update period TP1, in the update period TP2 next to the update period TP1. The time-to-digital converter 20 acquires the signal STP which corresponds to the generated signal STA and has a changed signal level. For example, the result of comparison processing in that TDF is longer than TR=$5\Delta t$ is obtained in the update period TP1. Therefore, a clock cycle is set to cause TR to increase, in the next update period TP2. For example, the time-to-digital converter 20 generates the signal STA in the fifth clock cycle causing TR=$5\Delta t$, in the update period TP1, but generates the signal STA in the 14th clock cycle causing TR=$14\Delta t$, in the update period TP2. Processing of comparing TDF in the 14th clock cycle to TR=$14\Delta t$ is performed. Here, the result of the comparison processing in that TDF is longer than TR=$14\Delta t$ is obtained.

The time-to-digital converter 20 generates the signal STA in the 10th clock cycle (CCT=10) set in accordance with the result of the comparison processing in the update period TP2, in the update period TP3 next to the update period TP2. For example, the result of the comparison processing in that TDF is shorter than TR=$14\Delta t$ is obtained in the update period TP2. Thus, a clock cycle causing TR to be reduced is set. For example, the time-to-digital converter 20 generates the signal STA in the 10th clock cycle causing TR=$10\Delta t$. Processing of comparing TDF in the 10th clock cycle to TR=10Δt is performed. Here, the result of the comparison processing in that TDF is the same (substantially the same) as TR=10Δt is obtained. Thus, it is determined that the digital value DQ corresponding to the time difference TDF is a digital value corresponding to TR=10Δt.

As described above, in FIG. 12, feedback of the result of the comparison processing in the previous update period is performed so as to set a clock cycle for generating the signal STA in the current update period. Then, the comparison processing between TDF and TR is performed. As described above, it is possible to increase the speed of time-digital conversion by performing feedback of the result of the comparison processing in the previous update period. Even in a case where the time or the physical quantity as a measurement target changes dynamically, it is possible to realize time-digital conversion following the dynamic change.

Various modifications of time-digital conversion in the embodiment may be made. For example, a method (repetitive method) of obtaining the digital value DQ corresponding to the time difference TDF in a manner that the signal STA is generated plural times in one measurement period in which a time is measured and phase comparison is performed plural times (for example, 1000 times or greater) may be employed. Alternatively, in FIG. 12, a clock cycle designation value (clock cycle designation information) for designating a clock cycle in which the signal STA is generated is stored in the storage unit (register) of the integrated circuit device 10. A method of obtaining the digital value DQ corresponding to the time difference TDF in a manner that processing of sequentially updating the clock cycle designation value stored in the storage unit is performed based on a result obtained by performing phase comparison between the signal STP and the clock signal CK2 in each of update periods TP1, TP2, TP3, . . . (method of updating a clock cycle designation value) may be employed. Alternatively, a method of obtaining the digital value DQ corresponding to the time difference TDF between the transition timings of the signals STA and STP, at resolution corresponding to the frequency difference between the clock frequencies f1 and f2 by binary search may be employed. Specifically, update of the clock cycle designation value based on the phase comparison result between the signal STP and the clock signal CK2 is realized by binary search. Alternatively, a search range of the digital value DQ may be narrowed by the method of binary search. Then, the signal STA may be generated for each clock cycle and phase comparison may be performed, by the method of updating the clock cycle designation value, in a period corresponding to the narrowed search range. Finally, the digital value DQ may be obtained. Alternatively, the digital value DQ corresponding to the time difference TDF between the transition timings of the signals STA and STP may be obtained based on the clock signals CK1 and CK2 generated by the resonators XTAL1 and XTAL2 and the signal STA which is input from the outside of the integrated circuit device 10 instead of spontaneously generating the signal STA in the integrated circuit device 10. For example, time-digital conversion may be performed while the oscillation circuits 101 and 102 perform an oscillation operation of the resonators XTAL1 and XTAL2 in a manner of free run.

5. Detailed Configuration Example of Integrated Circuit Device

Figure 13:
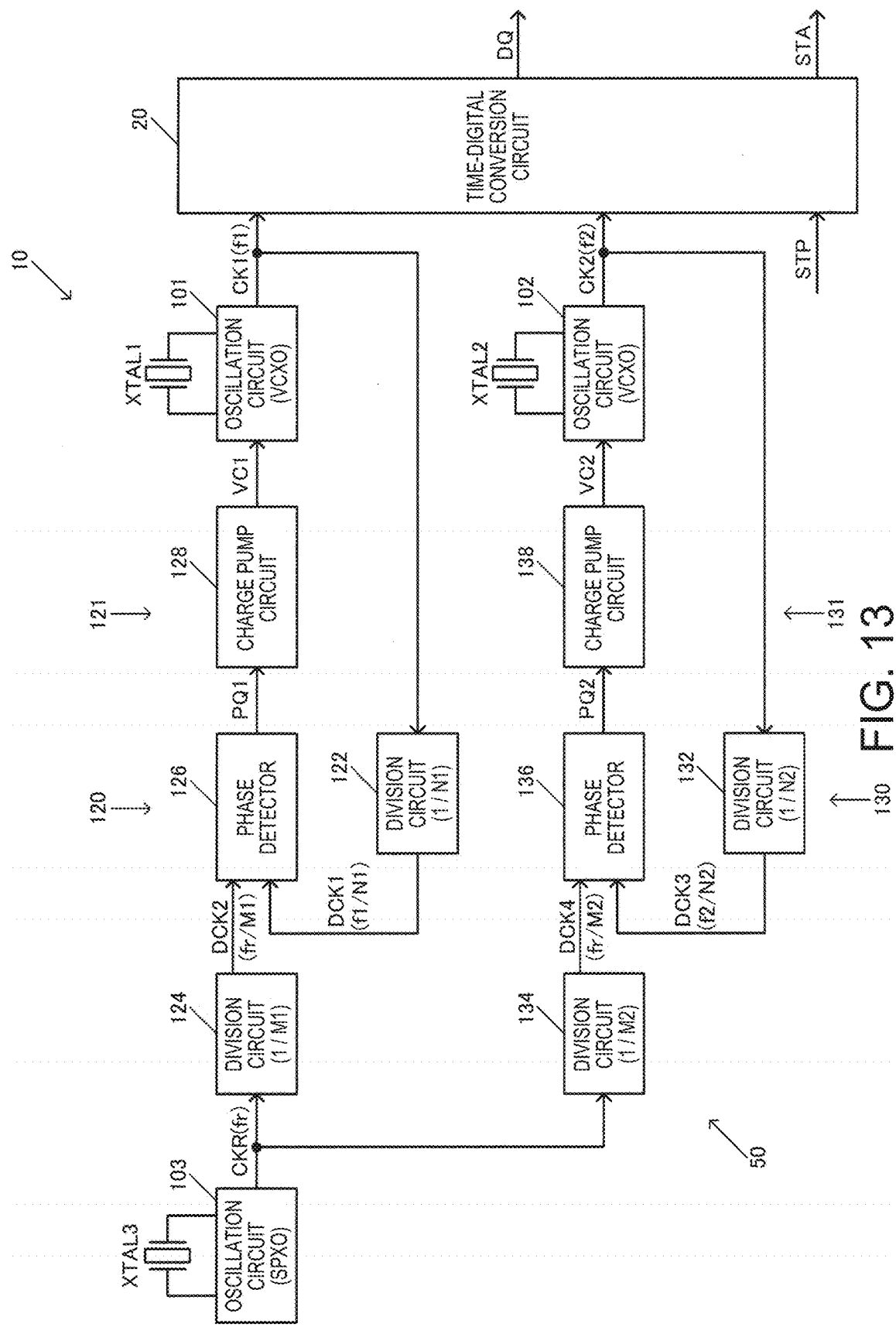
FIG. 13 illustrates a detailed configuration example of the integrated circuit device and the physical quantity measuring device.

FIG. 13 illustrates a detailed configuration example of the integrated circuit device 10. The integrated circuit device 10 in FIG. 13 includes the PLL circuits 120 and 130 and the oscillation circuit 103. The PLL circuit 120 performs phase synchronization between the clock signal CK1 and the reference clock signal CKR (causes the transition timings thereof to coincide with each other) for each first phase synchronization timing (for each first period). The PLL circuit 130 performs phase synchronization between the clock signal CK2 and the reference clock signal CKR (causes the transition timings thereof to coincide with each other) for each second phase synchronization timing (for each second period). Thus, phase synchronization between the clock signals CK1 and CK2 is performed. The clock frequency fr of the reference clock signal CKR is a frequency different from the clock frequencies f1 and f2 of the clock signals CK1 and CK2. For example, the clock frequency fr is lower than the clock frequencies f1 and f2. The reference clock signal CKR which has small jitter or a small phase error and has high precision can be generated by using a crystal resonator as the resonator XTAL3. Consequently, it is possible to reduce jitter or a phase error of the clock signals CK1 and CK2 and accuracy of time-digital conversion is improved.

The PLL circuit 120 includes the division circuits 122 and 124 and the phase detector 126. The division circuit 122 divides the clock frequency f1 of the clock signal CK1 by N1 and outputs a divided clock signal DCK1 having a clock frequency of f1/N1. The division circuit 124 divides the clock frequency fr of the reference clock signal CKR by M1 and outputs a divided clock signal DCK2 having a clock frequency of fr/M1. The phase detector 126 performs phase comparison between DCK1 and DCK2 and outputs a signal PQ1 which is an up or down signal, to a charge pump circuit 128. The oscillation circuit (VCXO) 101 generates the clock signal CK1 by performing an oscillation operation of the resonator XTAL1 having an oscillation frequency which is controlled based on a control voltage VC1 from the charge pump circuit 128. The PLL circuit 130 includes division circuits 132 and 134 and a phase detector 136. The division circuit 132 divides the clock frequency f2 of the clock signal CK2 by N2 and outputs a divided clock signal DCK3 having a clock frequency of f2/N2. The division circuit 134 divides the clock frequency fr of the reference clock signal CKR by M2 and outputs a divided clock signal DCK4 having a clock frequency of fr/M2. The phase detector 136 performs phase comparison between DCK3 and DCK4 and outputs a signal PQ2 which is an up or down signal, to the charge pump circuit 138. The oscillation circuit (VCXO) 102 generates the clock signal CK2 by performing an oscillation operation of the resonator XTAL2 having an oscillation frequency which is controlled based on a control voltage VC2 from the charge pump circuit 138.

The control signal generation circuit 121 in FIGS. 2 to 4 is realized by the division circuits 122 and 124, the phase detector 126, and the charge pump circuit 128, and the control signal generation circuit 131 is realized by the division circuits 132 and 134, the phase detector 136, and the charge pump circuit 138.

Figure 14:
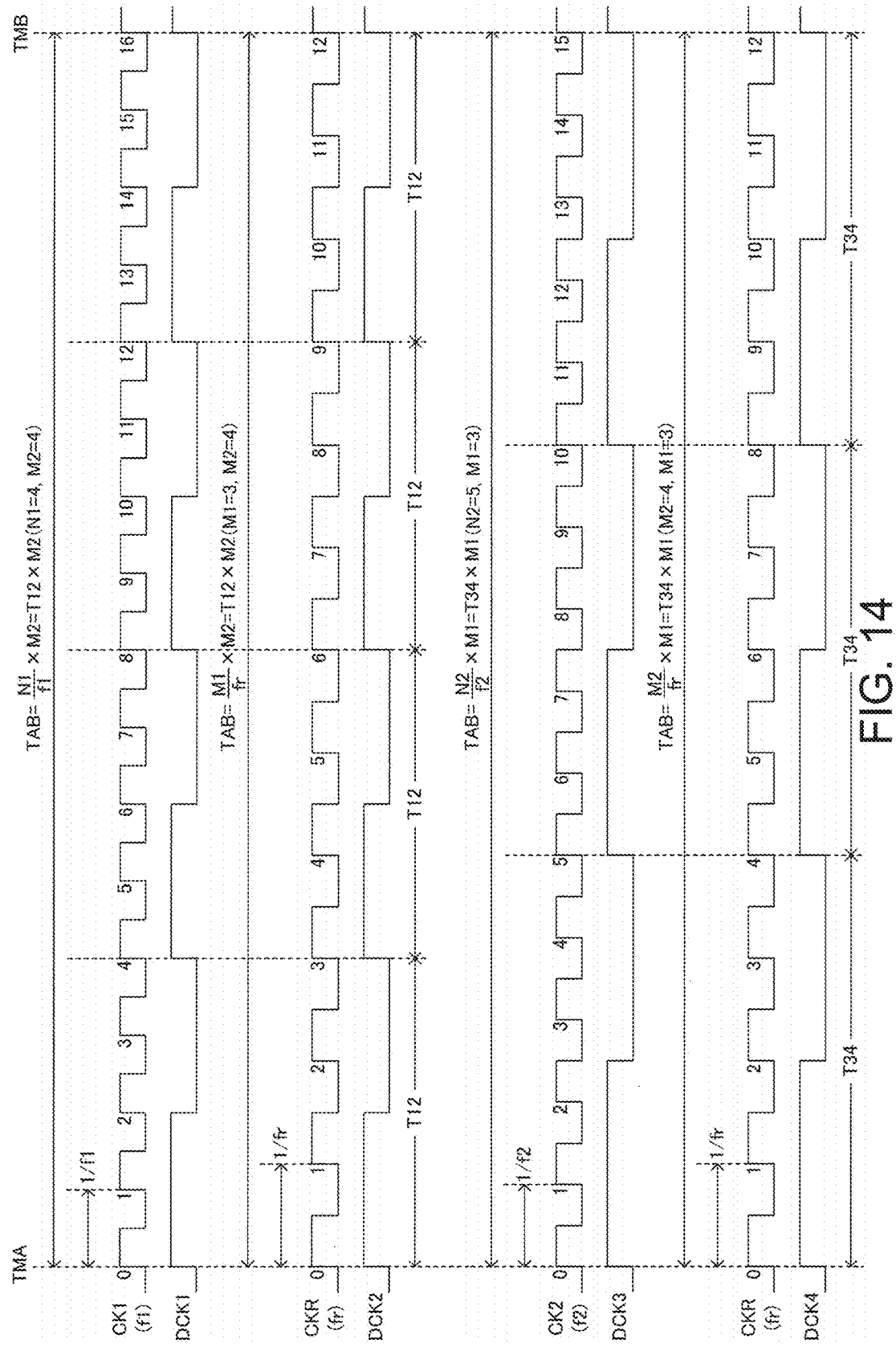
FIG. 14 is a signal waveform diagram illustrating time-digital conversion in the detailed configuration example.

FIG. 14 is a signal waveform diagram illustrating an operation of the integrated circuit device 10 in FIG. 13. FIG. 14 illustrates an example in which N1=4, M1=3, N2=5, and M2=4 are set for simple descriptions. In practice, N1, M1, N2, and M2 are set to have very large values.

As illustrated in FIG. 14, a signal obtained by dividing CK1 by N1 (=4) corresponds to DCK1, a signal obtained by dividing CKR by M1 (=3) corresponds to DCK2, and phase synchronization is performed for each period T12. That is, phase synchronization between CK1 and CKR is performed by the PLL circuit 120, so as to establish the relationship of T12=N1/f1=M1/fr. A signal obtained by dividing CK2 by N2 (=5) corresponds to DCK3, a signal obtained by dividing CKR by M2 (=4) corresponds to DCK4, and phase synchronization is performed for each period T34. That is, phase synchronization between CK2 and CKR is performed by the PLL circuit 130, so as to establish the relationship of T34=N2/f2=M2/fr. As described above, phase synchronization is performed on CK1 and CK2 for each period TAB by performing phase synchronization on CK1 and CKR for each period T12 and performing phase synchronization on CK2 and CKR for each period T34. Here, a relationship of TAB=T12×M2=T34×M1 is established. For example, in a case of M2=4 and M1=3, TAB=T12×4=T34×3 is established.

Division ratios N1, M1, N2, and M2 of the division circuits 122, 124, 132, and 134 in FIG. 13 are set to have very large values in practice. For example, in a case where the clock frequency fr of the reference clock signal CKR is 101 MHz, the division ratios are set to be N1=101 and M1=100, and thus the PLL circuit 120 generates the clock signal CK1 having a clock frequency f1 of 102.01 MHz. Since the division ratios are set to be N2=102 and M2=101, the PLL circuit 130 generates the clock signal CK2 having a clock frequency f2 of 102 MHz. Thus, the resolution in time-digital conversion can be set to $\Delta t = |1/f1 - 1/f2| = 0.96$ ps (picoseconds) and it is possible to realize time-digital conversion having high resolution.

N1 and M1 are integers which are 2 or greater and are different from each other. N2 and M2 are also integers which are 2 or greater and are different from each other. At least one of N1 and M1 and at least one of N2 and M2 are integers different from each other. Desirably, for N1 and N2, the greatest common divisor is 1 and the least common multiple is |N1×N2|. For M1 and M2, the greatest common divisor is 1 and the least common multiple is M1×M2. In the embodiment, N1, M1, N2, and M2 are set to establish a relationship of |N1×M2−N2×M1|=1. With an example in FIG. 14, in which N1=4, M1=3, N2=5, and M2=4 are set, |N1×M2−N2×M1|=|4×4−5×3|=1 is satisfied. This means that the length of 16 clocks of CK1 is equal to the length of 15 clocks of CK2. According to this configuration, CK1 and CK2 are shifted for each period TAB by one clock cycle (one clock period) and thus it is possible to realize time-digital conversion by using the principle of a Vernier caliper.

In FIGS. 13 and 14, phase synchronization between CK1 and CKR is performed for each period T12 which is shorter than the period TAB, and phase synchronization between CK2 and CKR is performed for each period T34 which is shorter than the period TAB. Thus, in comparison to a configuration example which will be described later and in which only one PLL circuit is provided, the frequency of performing phase comparison is increased and thus an occurrence of jitter (cumulative jitter) or phase noise in the clock signals CK1 and CK2 is reduced. In particular, in a case where N1, M1, N2, and M2 are set for realizing high resolution Δt, in the configuration example in which only one PLL circuit is provided, the length of the period TAB is very long. In addition, jitter or a phase error occurs largely by accumulating errors. On the contrary, in FIGS. 13 and 14, phase comparison is performed for each period T12 or T34 which is shorter than the period TAB. Thus, it is possible to reduce a cumulative error and to reduce the occurrence of jitter or a phase error.

The PLL circuits 120 and 130 in FIG. 13 have a circuit configuration of an analog type. However, a circuit configuration of a digital type (ADPLL) may be employed. In this case, it is possible to embody each of the PLL circuits (120 and 130) by a phase detector, a digital computation unit, and the like. The phase detector includes a counter and a TDC. The counter generates digital data corresponding to an integer part of a result obtained by dividing the clock frequency (fr) of the reference clock signal (CKR) by the clock frequency (f1, f2) of the clock signal (CK1, CK2). The TDC generates digital data corresponding to a decimal part of the division result. Digital data corresponding to a result obtained by adding the integer part and the decimal part is output to the digital computation unit. The digital computation unit detects a phase error from setting frequency data based on setting frequency data (FCW1, FCW2) and digital data of a comparison result from the phase detector. Then, the digital computation unit generates frequency control data by performing smoothing processing of the detected phase error and outputs the generated frequency control data to the oscillation circuit (101, 102). The oscillation circuit generates a clock signal (CK1, CK2) having an oscillation frequency which is controlled based on the frequency control data.

6. Oscillation Circuit

FIG. 15 illustrates a first configuration example of the oscillation circuit 100. Here, the oscillation circuit 100 is described as the representative of the oscillation circuits 101, 102, and 103. The oscillation circuit 100 in FIG. 15 includes an oscillation buffer circuit BAB, variable capacitance circuits CB1 and CB2 (capacitors) and a feedback resistor RB. The buffer circuit BAB can be configured by an inverter circuit having one or a plurality of stages (odd number stages). In FIG. 15, the buffer circuit BAB is configured by an inverter circuit having three stages (IV1, IV2, and IV3). The buffer circuit BAB (IV1 to IV3) may be a circuit capable of controlling enabling or disabling of oscillation or controlling a current to flow.

The variable capacitance circuits CB1 and CB2 are provided at one end (NB1) and the other end (NB2) of the resonator XTAL, respectively. The feedback resistor RB is provided between the one end and the other end of the resonator XTAL. The variable capacitance circuits CB1 and CB2 control the capacitance values based on control voltages (control signal) VC1 and VC2. The variable capacitance circuits CB1 and CB2 are realized by variable capacitance diodes (varactors) or the like. As described above, it is possible to adjust the oscillation frequency of the oscillation circuit 100 by controlling the capacitance value.

FIG. 16 illustrates a second configuration example of the oscillation circuit 100. The oscillation circuit 100 includes a current source IBX, a bipolar transistor TRX, a resistor RX, capacitors CX2 and CX3, and a variable capacitance circuit CX1 (variable capacitor). For example, the oscillation buffer circuit BAX is configured by the current source IBX, the bipolar transistor TRX, the resistor RX, and the capacitor CX3. The current source IBX supplies a bias current to a collector of the bipolar transistor TRX. The resistor RX is provided between the collector and a base of the bipolar transistor TRX. One end of the variable capacitance circuit CX1 in which capacitance is variable is connected to one end (NX1) of the resonator XTAL via a first terminal for an resonator (pad for resonator) in the integrated circuit device 10. One end of the capacitor CX2 is connected to the other end (NX2) of the resonator XTAL via a second terminal for an resonator (pad for resonator) in the integrated circuit device 10. One end of the capacitor CX3 is connected to one end of the resonator XTAL and the other end of the capacitor CX3 is connected to the collector of the bipolar transistor TRX.

A base-emitter current generated by oscillating the resonator XTAL flows in the bipolar transistor TRX. If the base-emitter current increases, a collector-emitter current of TRX increases and a collector voltage VCX decreases. If the base-emitter current of TRX decreases, the collector-emitter current decreases and the collector voltage VCX increases. The collector voltage VCX is fed back to the one end of the resonator XTAL via the capacitor CX3. That is, an AC component is cut off by the capacitor CX3 and a DC component is fed back. As described above, the oscillation buffer circuit BAX configured by the bipolar transistor TRX and the like operates as an inverting circuit (inverting amplifier circuit) that outputs an inverted signal (signal having a phase difference of 180 degrees) of a signal at a node NX2, to a node NX1. The capacitance value of the variable capacitance circuit CX1 configured by the variable capacitance diode and the like is controlled based on the control voltage VC. Thus, the oscillation frequency of the oscillation circuit 100 may be adjusted.

The oscillation circuit 100 is not limited to the configurations in FIGS. 15 and 16. Various modifications may be made. For example, the capacitance values of the variable capacitance circuits (CB1, CB2, and CX1) can be adjusted by using digital values. In this case, the variable capacitance circuit is configured by a plurality of capacitors (capacitor array) and a plurality of switching elements (switching array). ON and OFF of each of the switching elements are controlled based on frequency control data having a digital value.

7. Modification Example

Figure 17:
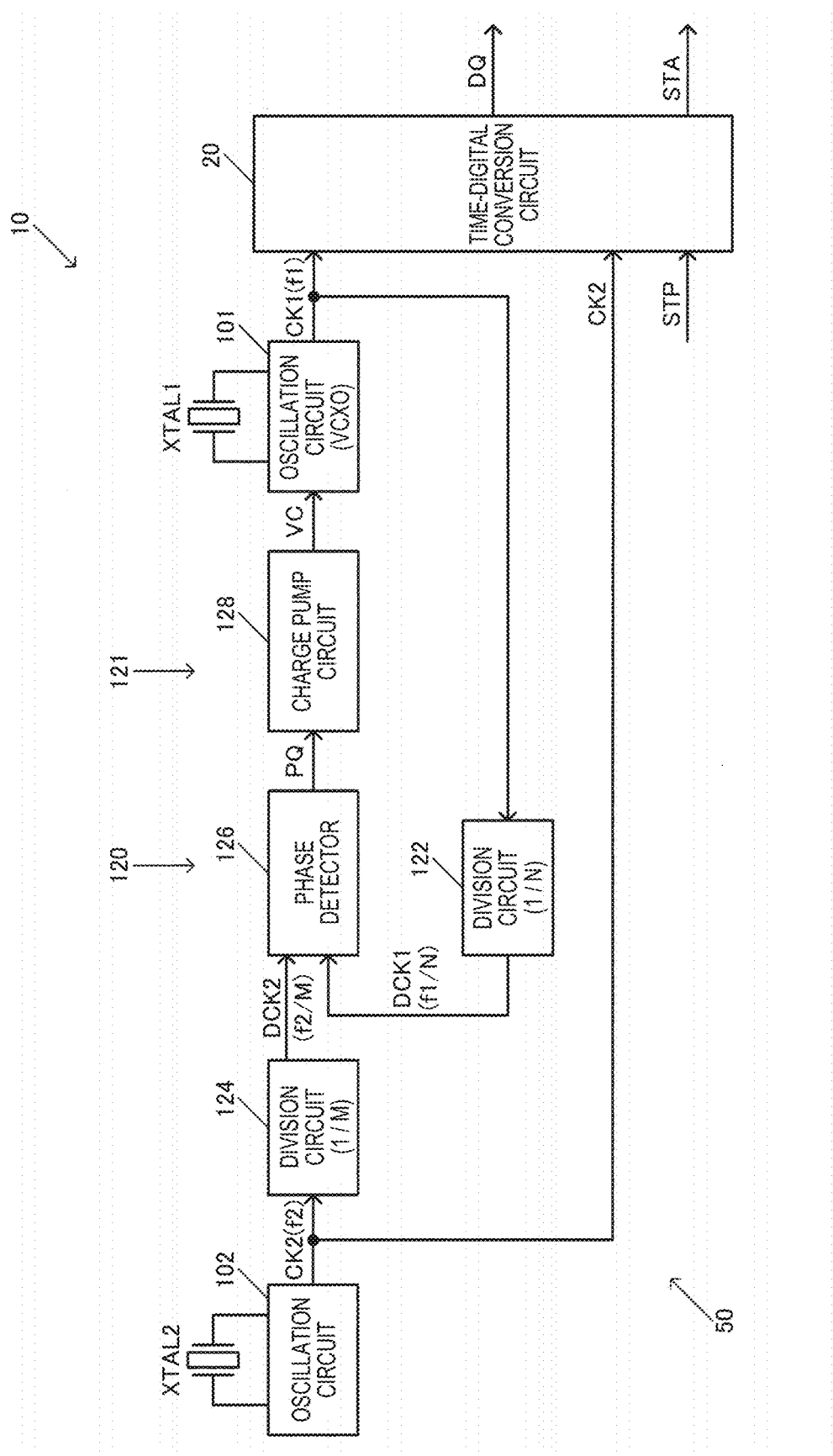
FIG. 17 illustrates a first modification example of the embodiment.

Next, various modification examples in the embodiment will be described. For example, in the embodiment, a case of providing the three resonators XTAL1 to XTAL3 is mainly described. However, the embodiment is not limited thereto. The number of resonators may be 2 or may be 4 or greater. For example, in the first modification example of the embodiment in FIG. 17, the two resonators XTAL1 and XTAL2 and one PLL circuit 120 are provided.

For example, the PLL circuit 120 performs phase synchronization between the clock signals CK1 and CK2. Specifically, in a case where the clock frequencies of the clock signals CK1 and CK2 are set to f1 and f2, the PLL circuit 120 performs phase synchronization between the clock signals CK1 and CK2 so as to satisfy N/f1=M/f2 (N and M are integers of 2 or greater, which are different from each other). The PLL circuit 120 includes the division circuits 122 and 124 and the phase detector 126. The division circuit 122 divides the clock frequency f1 of the clock signal CK1 by N and outputs a divided clock signal DCK1 having a clock frequency of f1/N. The division circuit 124 divides the clock frequency f2 of the clock signal CK2 by M and outputs a divided clock signal DCK2 having a clock frequency of f2/M. For example, the integrated circuit device 10 includes the oscillation circuit 102. The oscillation circuit 102 oscillates the resonator XTAL2 to generate the clock signal CK2 and outputs the generated clock signal CK2 to the division circuit 124. The phase detector 126 performs phase comparison between the divided clock signal DCK1 and the divided clock signal DCK2. With this configuration, it is possible to perform phase synchronization between the clock signals CK1 and CK2 for each phase synchronization timing.

In FIGS. 11 and 12, spontaneous type time-digital conversion of spontaneously generating the signal STA is described. In a case of a spontaneous type, the integrated circuit device 10 outputs the generated signal STA from, for example, the signal terminal PSA in FIG. 1 to the outside thereof. An external driving circuit having a pulsar and the like outputs the start pulse (driving signal) to a transmission device such as a light-emitting unit, based on the output signal STA. For example, in a case where the driving circuit is controlled by an external processing device such as a microcomputer, the signal STA may be output to the processing device and the processing device may instruct the driving circuit to output the start pulse. The driving circuit may be built in the transmission device such as the light-emitting unit. The signal STP which is the stop pulse is input from the receiving device such as the light-receiving unit to the signal terminal PSP of the integrated circuit device 10 and time-digital conversion is performed.

In this case, a time difference by a delay of the signal is provided in a period from an output timing of the signal STA of the integrated circuit device 10 to an output timing of the start pulse of the driving circuit. The time difference serves as an offset of a time-digital conversion value. In order to remove such an offset, for example, the start pulse (alternatively, start instruction signal of the processing device) output by the driving circuit may be brought back to the integrated circuit device 10, and the start pulse (start instruction signal) may be input, as a signal STA', to the signal terminal PSA in FIG. 1. At this time, the signal STA may be output from the signal terminal PSA and the signal STA' from the driving circuit may be input to the signal terminal PSA, by using the signal terminal PSA as an input and output terminal. Alternatively, a terminal which is used for outputting the signal STA and is separate from the signal terminal PSA may be provided. The time-to-digital converter 20 obtains a time difference TDSTA from a transition timing of the signal STA which has been spontaneously generated to a transition timing of the signal STA' input from the external driving circuit (processing device), by the method described with reference to FIGS. 11 and 12. In addition, the time-to-digital converter 20 obtains a time difference TDSTP from the transition timing of the signal STA to the transition timing of the signal STP. For example, a first time-digital conversion unit obtains the time difference TDSTA, and a second time-digital conversion unit obtains the time difference TDSTP. The time-digital conversion value (DQ) may be finally obtained from a differential value (TDSTP−TDSTA) of the time differences. According to this configuration, it is possible to remove an offset occurring by the time difference which occurs by the above-described signal delay, and to realize more appropriate time-digital conversion. It is not necessary that the time difference TDSTA is normally obtained. For example, the time difference TDSTA may be obtained only at an initial setting time such as a power-supplied time.

Figure 18:
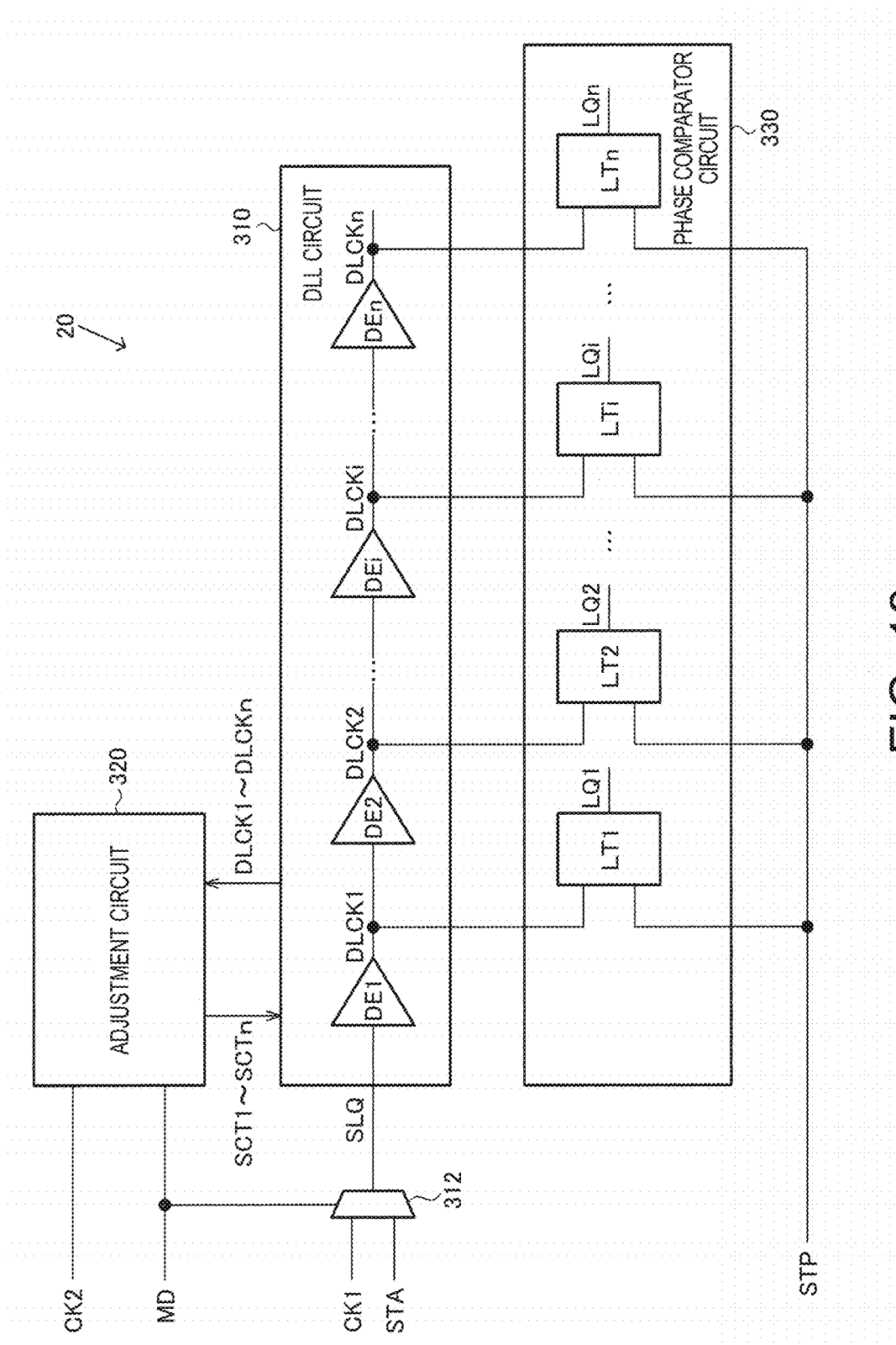
FIG. 18 illustrates a second modification example of the embodiment.
Figure 19:
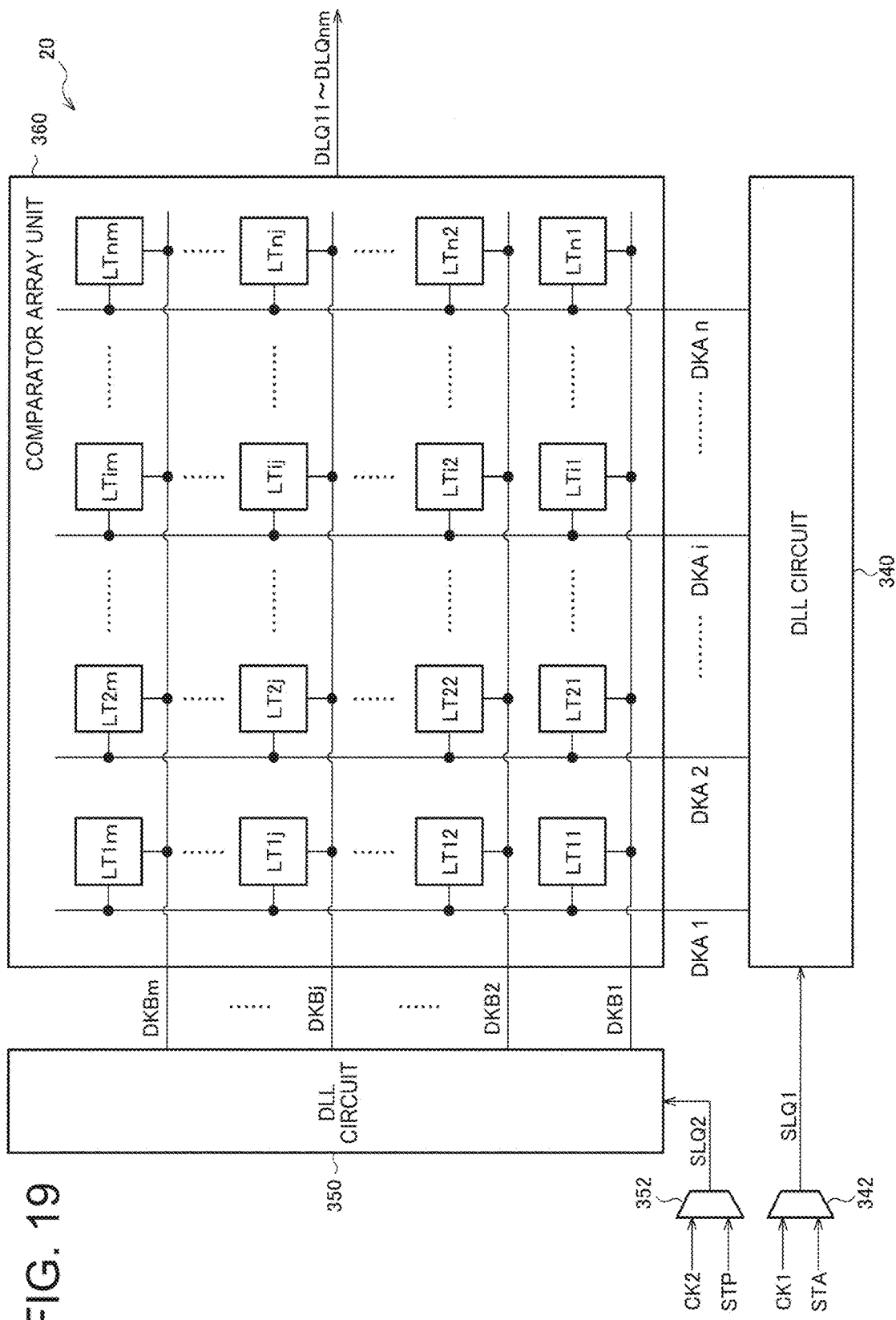
FIG. 19 illustrates a third modification example of the embodiment.

The time-to-digital converter 20 may be a passive type circuit that does not spontaneously generate the signal STA. FIGS. 18 and 19 illustrate configuration examples of the passive type time-to-digital converter 20 as second and third modification examples of the embodiment.

The time-to-digital converter 20 in FIG. 18 includes an adjustment circuit 320, a delay locked loop (DLL) circuit 310, a selector 312, and a phase comparator circuit 330. The DLL circuit 310 includes a plurality of delay elements DE1 to DEn. In a first mode, the clock signal CK1 is selected and the clock signal CK1 is input to the DLL circuit 310 as a signal SLQ. The adjustment circuit 320 performs adjustment based on delayed clock signals DLCK1 to DLCKn from the delay element DE1 to DEn and the clock signal CK2 such that a delay amount in each of the delay element satisfies $\Delta t=|1/f1-1/f2|$. Each of the delay elements DE1 to DEn includes a buffering circuit, and a variable capacitor connected to an output node of the buffering circuit or a variable current source that supplies a current to the buffering circuit. If the adjustment circuit 320 adjusts the capacitance value of the variable capacitor or the current value of the variable current source by using control signals SCT1 to SCTn, the delay amount in each of the delay elements is adjusted to satisfy $\Delta t=|1/f1-1/f2|$. In a second mode, the selector 312 selects the signal STA and the signal STA is input to the DLL circuit 310 as the signal SLQ. Phase comparators LT1 to LTn in the phase comparator circuit 330 compare phases of the delayed clock signals DLCK1 to DLCKn from the DLL circuit 310 to the phase of the signal STP. In a case where the transition timing of the signal STP is between the delayed clock signals DLCKi-1 and DLCKi, an output signal LQi of the phase comparator LTi is active. Thus, the time difference TDF in transition timing between the signals STA and STP can be specified as, for example, $i \times \Delta t$, and time-digital conversion at resolution of $\Delta t=|1/f1-1/f2|$ is possible.

FIG. 19 illustrates an example of a 2D Vernier type. The time-to-digital converter 20 includes DLL circuits 340 and 350, selectors 342 and 352, and a comparator array unit 360. The DLL circuit 340 includes a plurality of delay elements similar to that in FIG. 18. Delayed clock signals DKA1 to DKAn from the plurality of delay elements are output to the comparator array unit 360. The DLL circuit 350 also includes a plurality of delay elements. Delayed clock signals DKB1 to DKBm from the plurality of delay elements are output to the comparator array unit 360. In the DLL circuits 340 and 350, feedback control is performed on a delayed time (delay amount) of the delay element based on an output of at least one of the plurality of delay elements and the delayed time of the delay element is locked to be a desired delayed time. The comparator array unit 360 includes phase comparators LT11 to LTnm of n columns and m rows. A digital value corresponding to the time difference between the signals STA and STP is obtained based on digital signals DLQ11 to DLQnm which are phase comparison results from the phase comparators LT11 to LTnm.

In the first mode, the selectors 342 and 352 select the clock signals CK1 and CK2, respectively. The clock signal CK1 is input to the DLL circuit 340 as a signal SLQ1, and the clock signal CK2 is input to the DLL circuit 350 as a signal SLQ2. In the DLL circuit 340, the delayed time of each of the delay elements is locked such that the total delayed time of the plurality of delay elements becomes a time TCK1 which corresponds to one period of the clock signal CK1. In the DLL circuit 350, the delayed time of each of the delay elements is locked such that the total delayed time of the plurality of delay elements becomes a time TCK2 which corresponds to one period of the clock signal CK2. The clock frequencies of the clock signals CK1 and CK2 are set to satisfy $f1<f2$ (TCK1>TCK2). The numbers n and m of stages of the delay elements in the DLL circuits 340 and 350 satisfy n=m=k, that is, are the same as each other, respectively. Thus, the delayed time DLA (TCK1/k) of the delay element in the DLL circuit 340 is longer than the delayed time DLB (TCK2/k) of the delay element in the DLL circuit 350. In the second mode, the signal STA is input to the DLL circuit 340 and the signal STP is input to the DLL circuit 350, by the selectors 342 and 352. The transition timing of the signal STA is ahead of the transition timing of the signal STP. However, the delayed time DLA of the delay element in the DLL circuit 340 is longer than the delayed time DLB thereof in the DLL circuit 350. Thus, a time when the transition timing of the signal STA overtakes the transition timing of the signal STP is specified based on the digital signals DLQ11 to DLQnm from the comparator array unit 360, by the well-known method, and thus the digital value corresponding to the time difference between the signals STA and STP is obtained.

In the time-to-digital converter 20 in FIGS. 18 and 19, time-digital conversion is performed by using the clock signals CK1 and CK2 generated by using the resonators XTAL1 and XTAL2. Thus, performance of time-digital conversion is improved in comparison to a case of the method of the related art, which uses only the delayed time of the semiconductor element. In particular, there is an advantage that performance of time-digital conversion is further improved or processing is simplified, by the synchronization circuit such as the PLL circuit performing phase synchronization between the clock signals CK1 and CK2.

8. Electronic Apparatus and Vehicle

Figure 20:
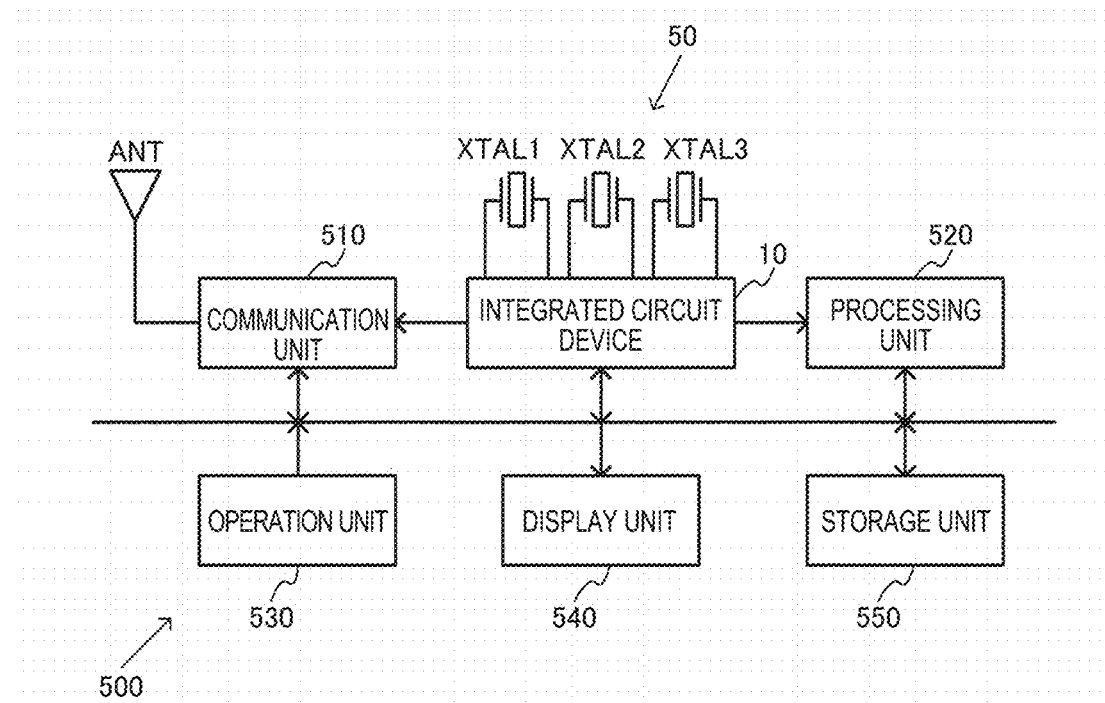
FIG. 20 illustrates a configuration example of an electronic apparatus.

FIG. 20 illustrates a configuration example of an electronic apparatus 500 including the integrated circuit device 10 in the embodiment. The electronic apparatus 500 includes the integrated circuit device 10, the resonators XTAL1 to XTAL3, and a processing unit 520. The electronic apparatus 500 may include a communication unit 510, an operation unit 530, a display unit 540, a storage unit 550, and an antenna ANT. As the electronic apparatus 500, for example, the followings can be assumed: a measuring device that measures the physical quantity such as a distance, a time, a flow rate, and a flow quantity; a biological information measuring device that measures biological information (ultrasonic measuring device, pulse wave meter, and the like); an in-vehicle device (device for automatic driving and the like); and a network-related device such as a base station or a router. In addition, the followings can be assumed: a wearable device such as a head-mounted display device or a clock-related device; a robot, a printing device, a projection device, a portable information terminal (such as a smartphone), a content providing device that distributes contents; and a video device such as a digital camera or a video camera.

The communication unit (wireless circuit) 510 performs processing of receiving data from the outside of the apparatus or transmitting data to the outside, via the antenna ANT. The processing unit (processing circuit) 520 performs control processing of the electronic apparatus 500 or various kinds of digital processing of data transmitted and received via the communication unit 510. The function of the processing unit 520 may be realized by a processor such as a microcomputer, for example. The operation unit 530 is used when a user performs an input operation. The operation unit 530 may be realized by an operation button, a touch panel display, and the like. The display unit 540 displays various kinds of information and may be realized by a display of liquid crystal, organic EL, or the like. The storage unit 550 stores data. The function thereof may be realized by a semiconductor memory such as a RAM or a ROM, an HDD (hard disk drive), or the like.

Figure 21:
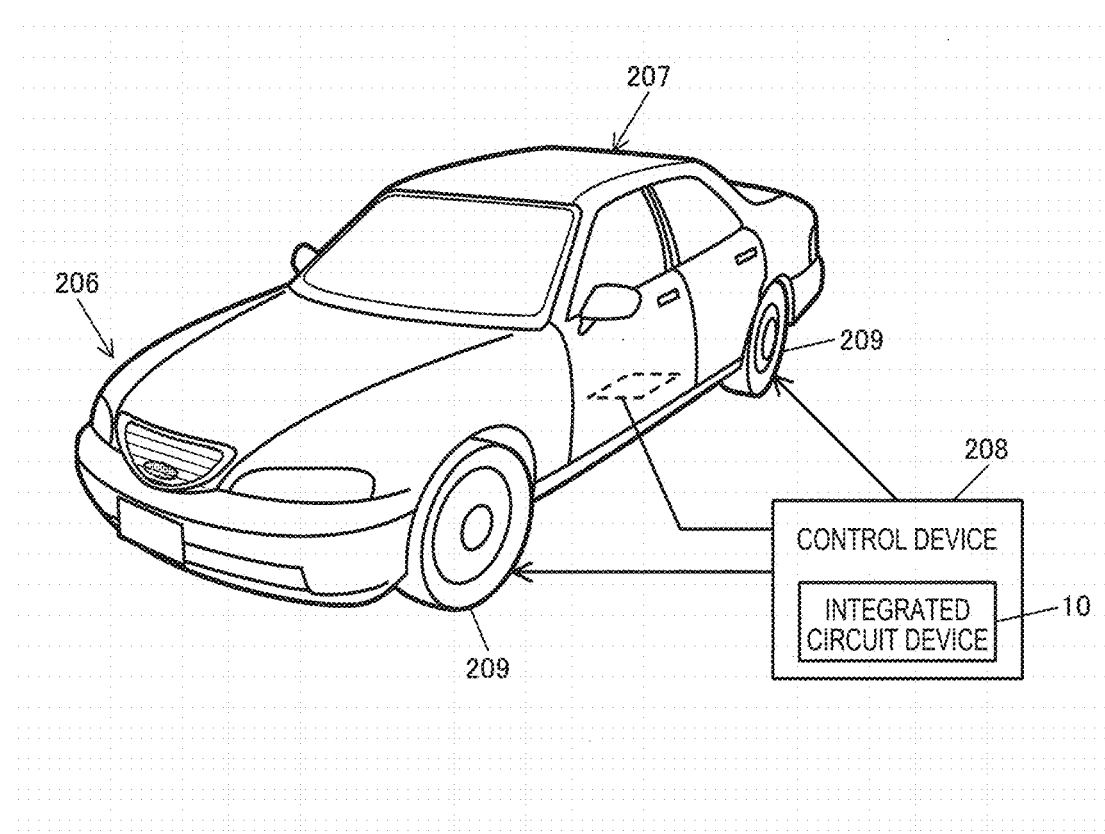
FIG. 21 illustrates a configuration example of a vehicle.

FIG. 21 illustrates an example of a vehicle including the integrated circuit device 10 in the embodiment. The integrated circuit device 10 in the embodiment can be incorporated into, for example, various vehicles such as cars, airplanes, motorcycles, bicycles, robots, and ships. The vehicle is an apparatus or a device that includes a driving mechanism such as an engine and a motor, a steering mechanism such as a steering wheel and a rudder, and various kinds of electronic apparatuses (in-vehicle apparatuses) and moves on the ground, the sky, or the sea. FIG. 21 schematically illustrates an automobile 206 as a specific example of the vehicle. The physical quantity measuring device (not illustrated) which includes the integrated circuit device 10 and the resonator in the embodiment is incorporated into the automobile 206. A control device 208 performs various kinds of control processing based on physical quantity information measured by the physical quantity measuring device. For example, in a case where distance information of an object around the automobile 206 is measured as the physical quantity information, the control device 208 performs various kinds of control processing for automatic driving, by using the measured distance information. The control device 208 controls the hardness of a suspension in accordance with the posture of a vehicle body 207 or controls the break for each wheel 209. A device into which the integrated circuit device 10 in the embodiment is incorporated is not limited to such a control device 208. The integrated circuit device 10 can be incorporated into various devices provided in a vehicle such as the automobile 206 or a robot.

Hitherto, the embodiment is specifically described. However, those skilled in the related art can easily understand that many modifications can be made without substantially departing from the novel matters and effects of the invention. Thus, all such modification examples are included in the scope of the invention. For example, in the specification or the drawings, a term (for example, PLL circuit) described together with a different term (for example, clock signal generation circuit) which is broader or equivalent can be replaced with the different term at any point in the specification or the drawings, at least once. In addition, all combinations of the embodiment and the modification examples are included in the scope of the invention. The configurations and the operations of the integrated circuit device, the physical quantity measuring device, the electronic apparatus, and the vehicle, the layout of the integrated circuit device, or the like is not limited to those described in the embodiment and various modifications may be made.

The entire disclosure of Japanese Patent Application No. 2017-143162, filed Jul. 25, 2017 is expressly incorporated by reference herein.

What is claimed is:

1. An integrated circuit device that performs signal processing based on a first signal and a second signal, the device comprising:
 a terminal region having a second signal terminal to which the second signal is input;
 an analog front-end circuit configured to perform waveform shaping of the second signal;
 a time-to-digital converter configured to convert a time difference between a transition timing of the first signal and a transition timing of the second signal subjected to the waveform shaping, to a digital value;
 a first clock signal generation circuit including a first oscillation circuit that is configured to output a first clock signal oscillating a first resonator; and
 a second clock signal generation circuit including a second oscillation circuit that is configured to output a second clock signal oscillating a second resonator,
 wherein the integrated circuit has first and second sides opposite to each other, and a direction from the first side toward the second side is set as a first direction,
 the analog front-end circuit is disposed on a distal end side of the terminal region in the first direction, and
 the time-to-digital converter is disposed on at least one side of the distal end side of the analog front-end circuit in the first direction or a lateral side of the analog front-end circuit located in a direction intersecting the first direction, and
 wherein the time-to-digital converter is configured to perform time-digital conversion based on the first clock signal and the second clock signal.

2. The integrated circuit device according to claim 1, wherein the first clock signal generation circuit and the second clock signal generation circuit are disposed on the distal end side of the time-to-digital converter in the first direction.

3. The integrated circuit device according to claim 1, further comprising:
 a first oscillation terminal connected to the first oscillation circuit;
 a second oscillation terminal connected to the first oscillation circuit;
 a third oscillation terminal connected to the second oscillation circuit; and
 a fourth oscillation terminal connected to the second oscillation circuit,
 wherein the first oscillation terminal is disposed at a position overlapping the first resonator in the plan view, and the second oscillation terminal is disposed at a position which is laterally shifted from the first resonator in the plan view, and
 the third oscillation terminal is disposed at a position overlapping the second resonator in the plan view, and the fourth oscillation terminal is disposed at a position which is laterally shifted from the second resonator in the plan view.

4. The integrated circuit device according to claim 3, wherein an area of the first oscillation terminal is larger than an area of the second oscillation terminal in the plan view, and
 an area of the third oscillation terminal is larger than an area of the fourth oscillation terminal in the plan view.

5. The integrated circuit device according to claim 3, wherein the first clock signal generation circuit is a first PLL circuit that includes the first oscillation circuit and a first control signal generation circuit that outputs a control signal for controlling an oscillation frequency of the first oscillation circuit to the first oscillation circuit,
 the second clock signal generation circuit is a second PLL circuit that includes the second oscillation circuit and a second control signal generation circuit that outputs a control signal for controlling an oscillation frequency of the second oscillation circuit to the second oscillation circuit, and
 the first control signal generation circuit and the second control signal generation circuit are disposed between the first oscillation terminal and the third oscillation terminal in the plan view.

6. The integrated circuit device according to claim 1, further comprising:
 a third oscillation circuit that generates a reference clock signal by oscillating a third resonator, wherein the first clock signal generation circuit generates the first clock signal having a phase synchronized with the reference clock signal, and the second clock signal generation circuit generates the second clock signal having a phase synchronized with the reference clock signal.

7. The integrated circuit device according to claim 6, wherein the third oscillation circuit is disposed on the distal end side of the first clock signal generation circuit and the second clock signal generation circuit in the first direction.

8. The integrated circuit device according to claim 6, further comprising:

a fifth oscillation terminal connected to the third oscillation circuit; and a sixth oscillation terminal connected to the third oscillation circuit, wherein the fifth oscillation terminal is disposed at a position overlapping the third resonator in the plan view, and the sixth oscillation terminal is disposed at a position which is laterally shifted from the third resonator in the plan view.

9. The integrated circuit device according to claim 1, wherein an area of the integrated circuit device is divided into first and second regions by a reference line extending along the first direction, the first clock signal generation circuit is disposed in the first region of the integrated circuit device, and the second clock signal generation circuit is disposed in the second region of the integrated circuit device.

10. The integrated circuit device according to claim 1, wherein the analog front-end circuit outputs first to n-th stop signals by comparing a voltage level of the second signal and a plurality of threshold voltages, and the time-to-digital converter includes first to n-th time-digital conversion units that perform the time-digital conversion based on the first to n-th stop signals and first to n-th start signals which are based on the first signal, and wherein the n is an integer of 2 or greater.

11. The integrated circuit device according to claim 10, wherein the first to n-th time-digital conversion units are disposed on the distal end side of the analog front-end circuit in the first direction.

12. The integrated circuit device according to claim 10, wherein K time-digital conversion units, wherein the K is an integer of 1 or greater, among the first to n-th time-digital conversion units are disposed on the distal end side of the analog front-end circuit in the first direction, and L time-digital conversion units, wherein the L is an integer of 1 or greater, which are different from the K time-digital conversion units are disposed on the lateral side of the analog front-end circuit.

13. The integrated circuit device according to claim 1, wherein a first signal terminal to which the first signal is input is further disposed in the terminal region, the analog front-end circuit further performs the waveform shaping of the first signal, and the time-to-digital converter converts a time difference between the transition timing of the first signal subjected to the waveform shaping and the transition timing of the second signal subjected to the waveform shaping, to a digital value.

14. A physical quantity measuring device comprising:
the integrated circuit device according to claim 1;

the first resonator connected to the first clock generation circuit;

the second resonator connected to the second clock generation circuit; and a package housing the integrated circuit device and the first and second resonators.

15. An electronic apparatus comprising:
the integrated circuit device according to claim 1;
the first resonator connected to the first clock generation circuit;
the second resonator connected to the second clock generation circuit;
a display displaying information; and
a case housing the integrated circuit device, the first and second resonators, and the display.

16. A vehicle comprising:
the integrated circuit device according to claim 1; and
a controller controlling part of the vehicle in response to a signal from the integrated circuit device.

17. An integrated circuit device that performs signal processing based on a first signal and a second signal, the device comprising:

a terminal region having a second signal terminal to which the second signal is input;

an analog front-end circuit configured to perform waveform shaping of the second signal; and a time-to-digital converter configured to convert a time difference between a transition timing of the first signal and a transition timing of the second signal subjected to the waveform shaping to a digital value, wherein the integrated circuit has first and second sides opposite to each other, and a direction from the first side toward the second side is set as a first direction, the analog front-end circuit is disposed on a distal end side of the terminal region in the first direction, the time-to-digital converter is disposed on at least one side of the distal end side of the analog front-end circuit in the first direction or a lateral side of the analog front-end circuit located in a direction intersecting the first direction, the analog front-end circuit outputs first to n-th stop signals by comparing a voltage level of the second signal and a plurality of threshold voltages, the time-to-digital converter includes first to n-th time-digital conversion units that perform the time-digital conversion based on the first to n-th stop signals and first to n-th start signals which are based on the first signal, and wherein the n is an integer of 2 or greater.

18. An integrated circuit device that performs signal processing based on a first signal and a second signal, the device comprising:

a terminal region having a second signal terminal to which the second signal is input;

an analog front-end circuit configured to perform waveform shaping of the second signal; and a time-to-digital converter configured to convert a time difference between a transition timing of the first signal and a transition timing of the second signal subjected to the waveform shaping to a digital value, wherein the integrated circuit has first and second sides opposite to each other, and a direction from the first side toward the second side is set as a first direction, the analog front-end circuit is disposed on a distal end side of the terminal region in the first direction, the time-to-digital converter is disposed on at least one side of the distal end side of the analog front-end circuit in the first direction or a lateral side of the analog front-end circuit located in a direction intersecting the first direction, wherein a first signal terminal to which the first signal is input is further disposed in the terminal region, the analog front-end circuit further performs the waveform shaping of the first signal, and the time-to-digital converter converts a time difference between the transition timing of the first signal subjected to the waveform shaping and the transition timing of the second signal subjected to the waveform shaping to a digital value.

* * * * *